United States Patent
Kitagawa et al.

(10) Patent No.: US 7,307,822 B2
(45) Date of Patent: Dec. 11, 2007

(54) SEMICONDUCTOR INTEGRATED CIRCUIT APPARATUS

(75) Inventors: Nobutaka Kitagawa, Machida (JP); Hirotomo Ishii, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 375 days.

(21) Appl. No.: 11/020,069

(22) Filed: Dec. 20, 2004

(65) Prior Publication Data

US 2005/0135033 A1 Jun. 23, 2005

(30) Foreign Application Priority Data

Dec. 22, 2003 (JP) ............... 2003-424693

(51) Int. Cl.
*H02H 3/20* (2006.01)
*H02H 9/04* (2006.01)
*H02H 3/22* (2006.01)
*H02H 9/00* (2006.01)

(52) U.S. Cl. ............. 361/91.1; 361/91.5; 361/56; 361/54

(58) Field of Classification Search ............. 361/91.1, 361/54, 91.5
See application file for complete search history.

(56) References Cited

U.S. PATENT DOCUMENTS 6,034,854 A * 3/2000 Suga .................. 361/56
2003/0214773 A1 11/2003 Kitagawa 2004/0120087 A1 * 6/2004 Ishii ..................... 361/56

FOREIGN PATENT DOCUMENTS

| JP | 8-316418 | 11/1996 |
| JP | 2000-269432 | 9/2000 |
| JP | 2002-118253 | 4/2002 |
| JP | 2004-119883 | 4/2004 |

OTHER PUBLICATIONS

Ming-Dou Ker, et al., entitled "A Gate-Coupled PTLSCR/NTLSCR ESD Protection Circuit for Deep-Submicron Low-Voltage CMOS IC's," IEEE Journal of Solid-State Circuits, vol. 32, No. 1, Jan. 1997, pp. 38-51.

* cited by examiner

*Primary Examiner*—Michael Sherry
*Assistant Examiner*—Dharti H Patel
(74) *Attorney, Agent, or Firm*—DLA Piper US LLP

(57) ABSTRACT

A semiconductor integrated circuit device is disclosed, which comprises power supply system circuits, in which power supply terminals and/or ground terminals are separated from each other between the power supply system circuits, an electrostatic discharge protecting circuit, an internal circuit provided in each of the power supply system circuits, an internal signal transmitting line, a surge input detecting circuit, and at least one of an input protecting circuit which is provided at an input side of the internal circuit and which limits a voltage of a signal transmitted from the internal signal transmitting line, and an output logic setting circuit which is provided at an output side of the internal circuit and which sets a logic level of a signal outputted to the internal signal transmitting line to a low level when the surge input detecting circuit has detected a surge input.

15 Claims, 12 Drawing Sheets

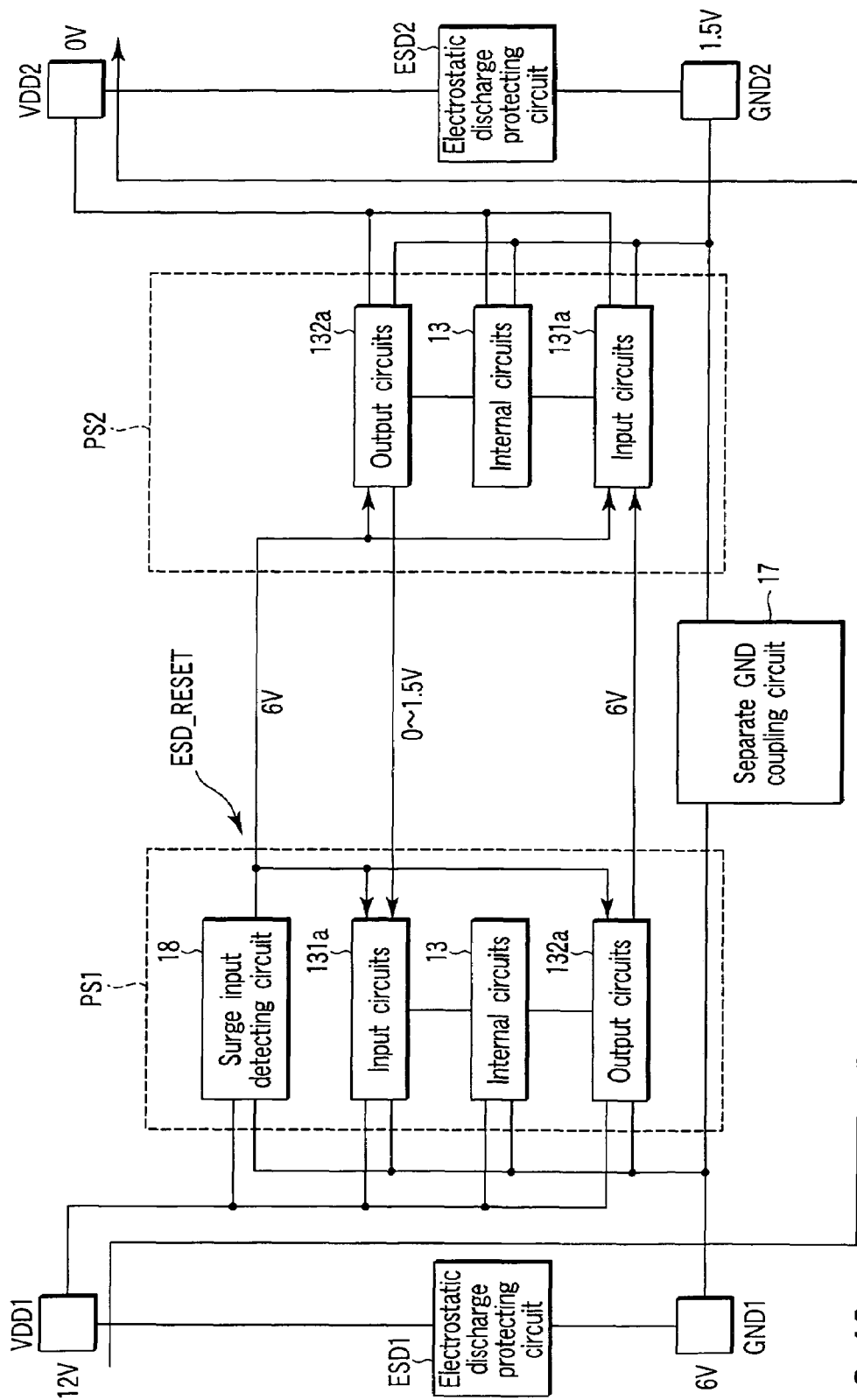
F I G. 13

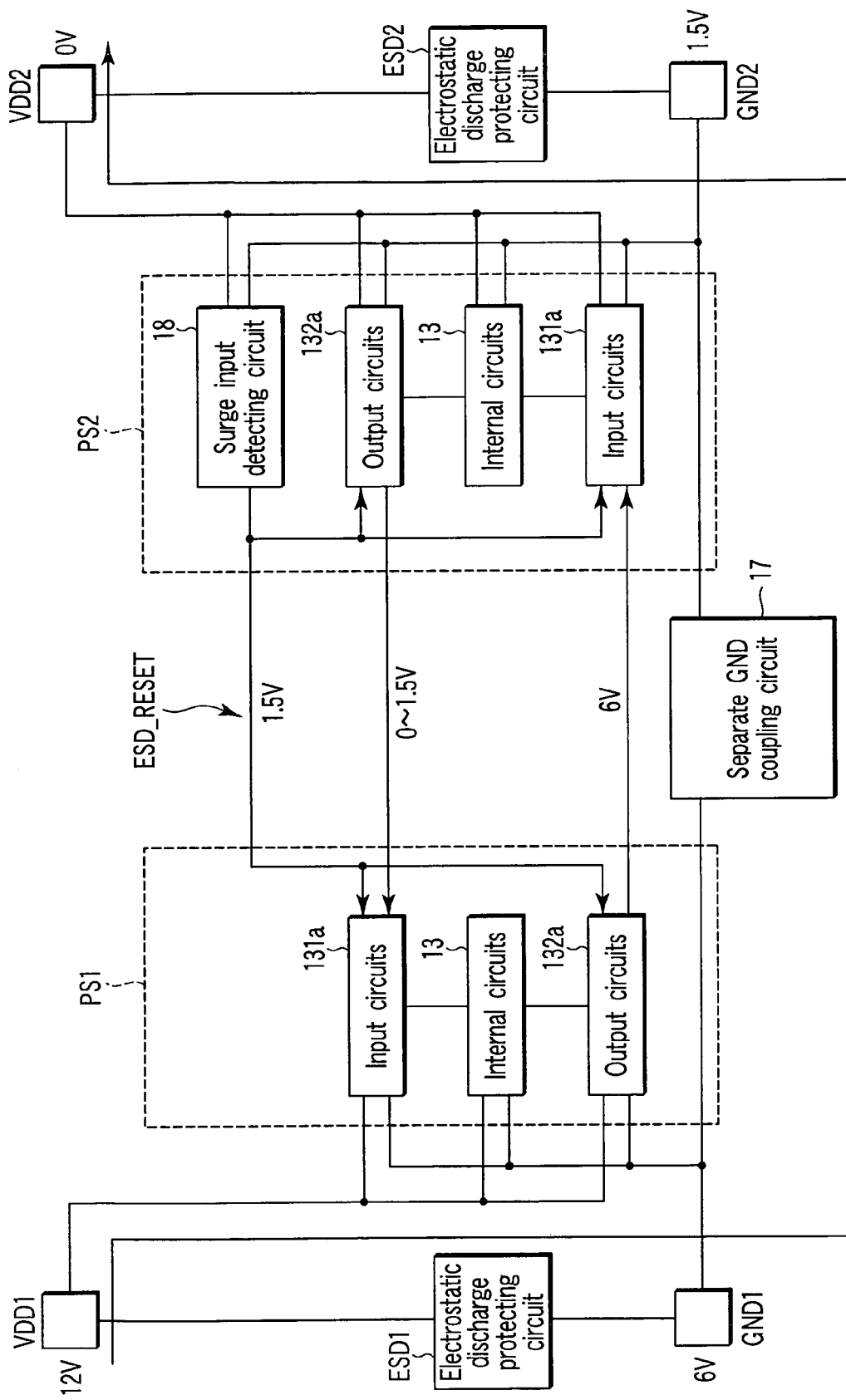
F I G. 14

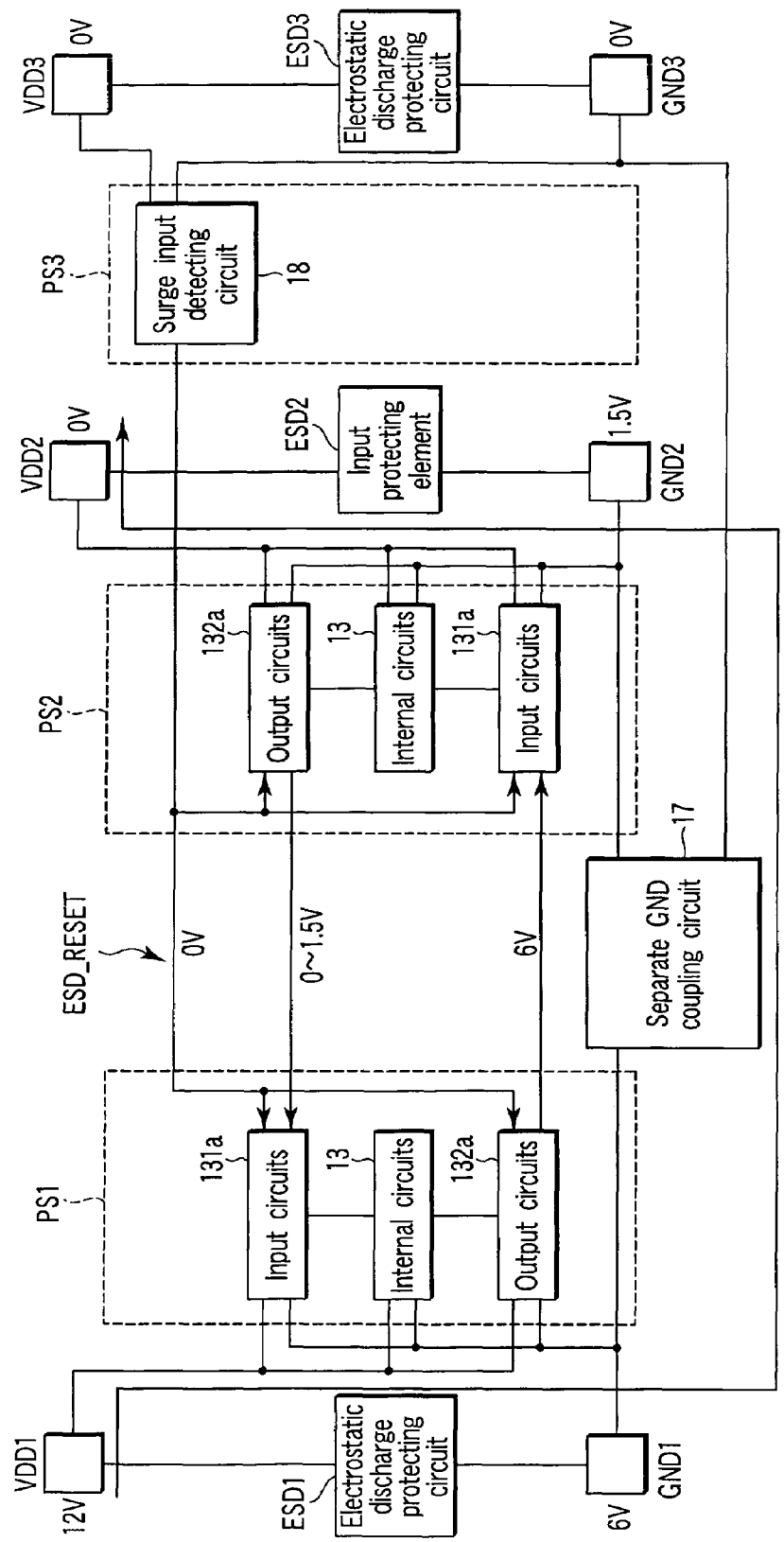
F I G. 15

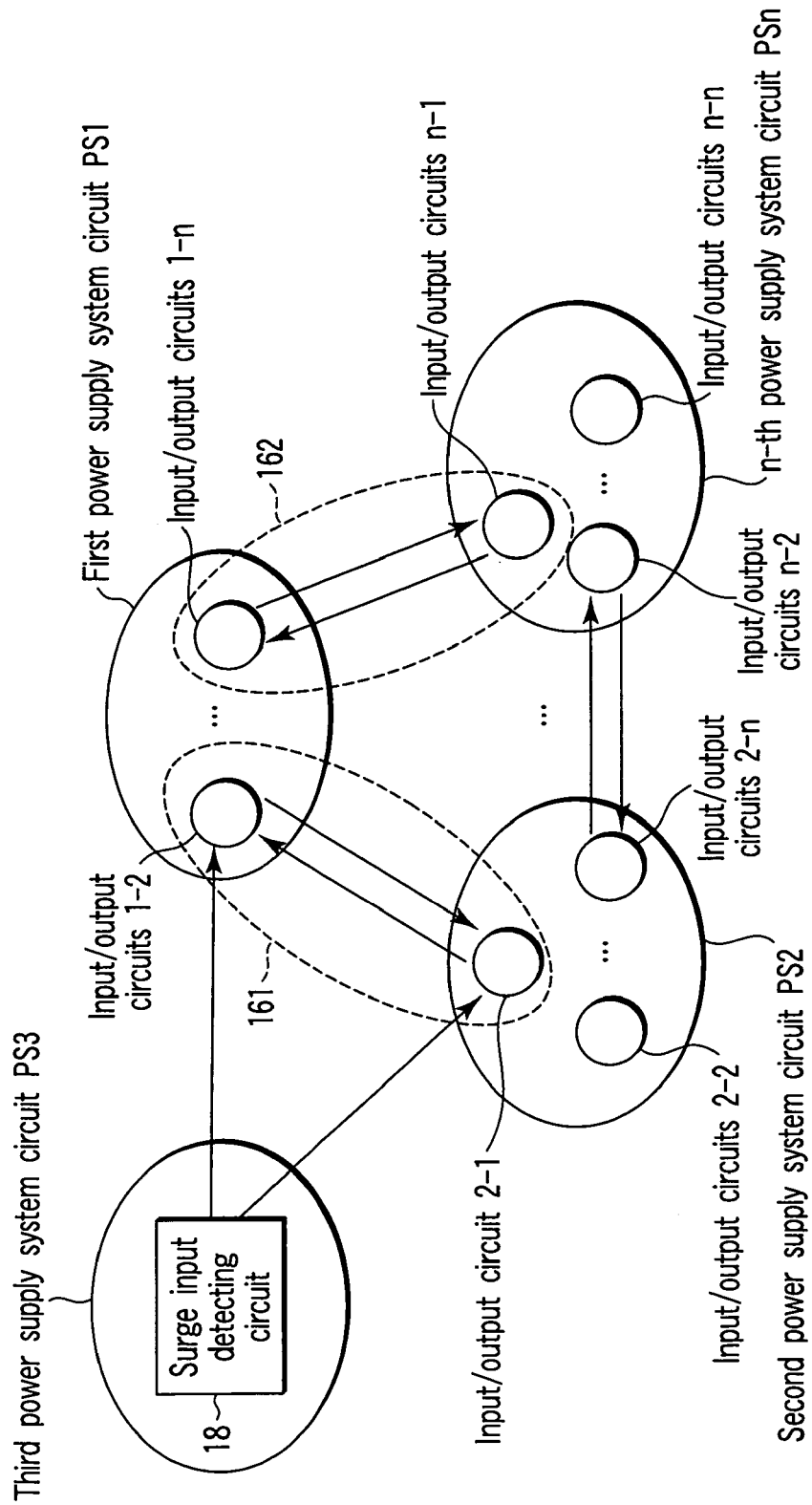
F I G. 17

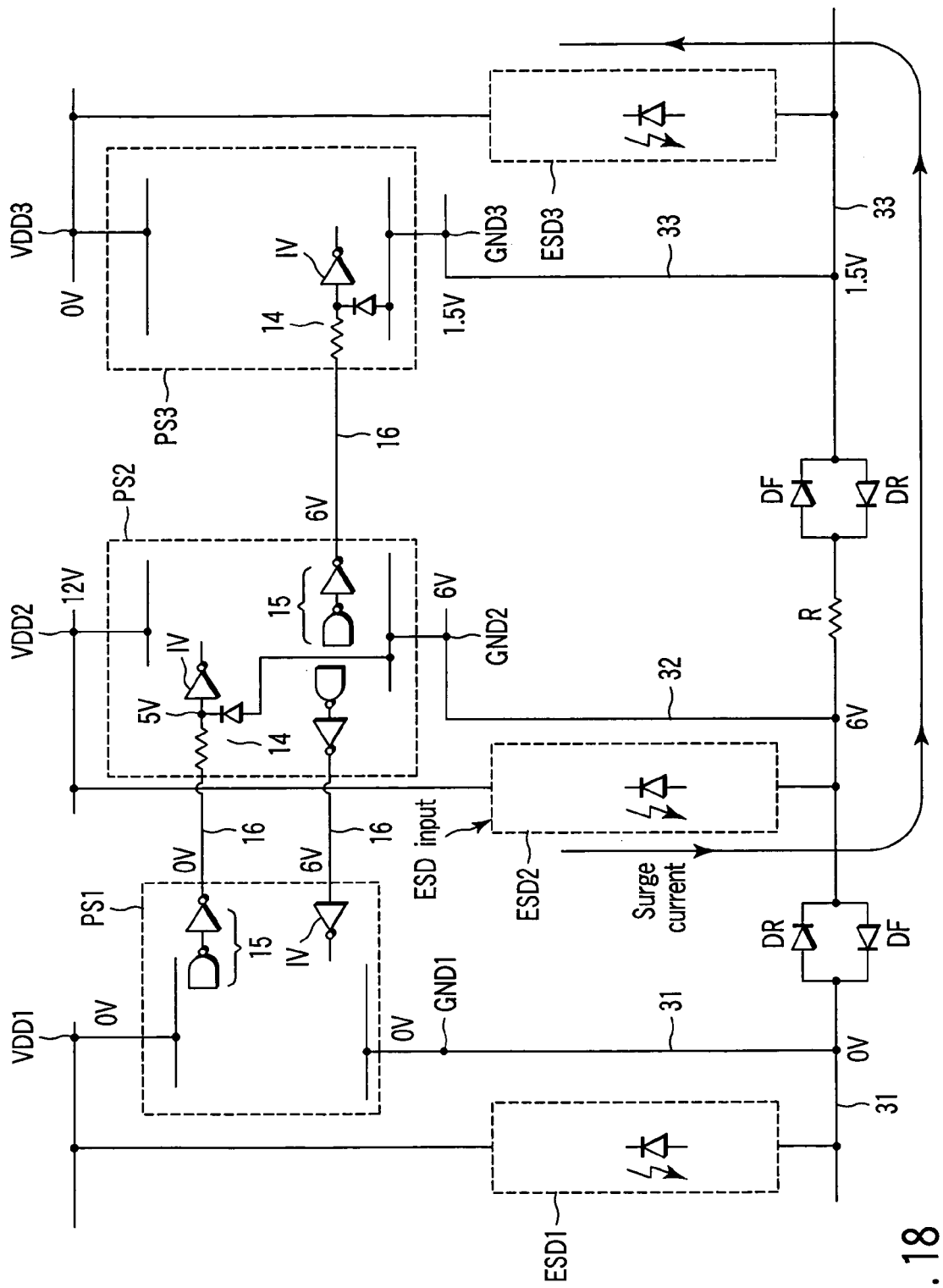
F I G. 18

SEMICONDUCTOR INTEGRATED CIRCUIT APPARATUS

CROSS-REFERENCE TO RELATED APPLICATIONS

This application is based upon and claims the benefit of priority from prior Japanese Patent Application No. 2003-424693, filed Dec. 22, 2003, the entire contents of which are incorporated herein by reference.

BACKGROUND OF THE INVENTION

1. Field of the Invention

The present invention relates to a semiconductor integrated circuit apparatus. More particularly, the present invention relates to an ESD (Electrostatic Discharge) protecting circuit apparatus incorporated in order to protect an internal circuit from a surge input of an electrostatic discharge applied to an external terminal. The electrostatic discharge protecting circuit apparatus is applied to a CMOS LSI of low power supply voltage type using a silicon controlled rectifier (SCR) element as a voltage clamping element for ESD protection, for example.

2. Description of the Related Art

For example, an electrostatic discharge protecting circuit connected between an external terminal and an internal circuit in order to protect an input circuit or an output circuit of a CMOS LSI uses a diode, a transistor, or a SCR as a protecting element.

Such an electrostatic discharge protecting circuit using an SCR is high in trigger voltage of the SCR in general. Thus, in the case where the electrostatic discharge protecting circuit is applied to a fine CMOS LSI operable in a low power supply voltage, it is necessary to reduce the trigger voltage in order to protect a MOS transistor with a low gate breakdown voltage.

From such a background, an example in which an electrostatic discharge protecting circuit using an SCR has been applied to a CMOS LSI of low power supply voltage type is disclosed in "A Gate-Coupled PTLSCR/NTLSCR ESD Protection Circuit for Deep-Submicron Low-Voltage CMOS IC's 1", IEEE JOURNAL OF SOLID-STATE CIRCUITS, VOL. 32, NO. 1, January 1997". The electrostatic discharge protecting circuit applies triggering by utilizing a transient potential change when a surge input to an input pad to which the SCR is connected. However, a satisfactory protecting characteristic cannot be obtained.

In order to solve this problem, the applicants have proposed a technique of applying an electrostatic discharge protecting circuit to an LSI with a low power supply voltage disclosed in Japanese Patent Application KOKAI Publication No. 2003-318265, thereby achieving a preferable protecting characteristic by applying a low voltage trigger and enhancing reliability.

In the proposed circuit, when an input of a surge voltage becomes a problem, a normal power supply potential VDD is not applied yet, and a gate of a PMOS transistor for trigger input is set to the ground potential GND.

Therefore, in this state, when a surge voltage with a positive polarity is inputted to an input pad of an input circuit, and if a bias voltage in the forward direction that is greater than an absolute value of the gate threshold voltage Vthp of the PMOS transistor is applied between the gate and source of the PMOS transistor, the gate of the PMOS transistor is turned ON.

In this manner, a trigger is applied to the SCR, the SCR is turned ON, a surge current is discharged to the GND, and an input gate of an input circuit connected to the electrostatic discharge protecting circuit is protected. In this case, the absolute value of the gate threshold voltage Vthp of the PMOS transistor is small, thus making it possible to start operation of the SCR by a low voltage trigger.

In an LSI of analog and digital mixed type in which a thin oxide element is used in general, signals with a low voltage are transmitted and/or received between a plurality of power supply system circuits of different power supply systems. In an LSI in which an analog circuit which is weak in interference of a noise signal, a low voltage differential signal circuit (LVDS) which is operable at a high speed, a dynamic type semiconductor memory (embedded type DRAM) and the like are incorporated as the power supply system circuits, a ground line separation technique which separates ground lines of the power supply system circuits from each other is effective in terms of reducing interference of a noise signal caused between the plurality of power supply system circuits or enabling selective setting of those of the power supply system circuits which are out of use to a standby state.

In a conventional LSI in which the ground line separation technique and a plurality of power supply systems of different power supply systems are employed and electrostatic discharge protecting circuits are provided, electrostatic discharge protecting circuits are provided correspondingly to the power supply system circuits and connected between power supply terminals and ground terminals of the power supply system circuits. Internal circuits are provided to the power supply system circuits, correspondingly. Internal signal transmission lines are provided each to transmit a signal from an internal circuit of a power supply system circuit to an internal circuit of another power supply system circuit.

The ground terminals of the power supply system circuits are connected to each other via a circuit for discharging a current due to ESD and a wiring. An example of the discharging circuit is comprised of a circuit comprising two diodes connected to each other in opposite directions.

When a surge current due to ESD flows through the discharging circuit and the wiring, a voltage drop occurs across the discharging circuit and the wiring, and the potential difference between the ground terminals increases. Thus, a voltage greater than a rated voltage is applied to an input gate of an internal circuit whose input node is connected to the internal signal transmitting line, and there will arise a situation that the input gate is broken down.

As a countermeasure for this problem, the size of the electrostatic discharge protecting circuit is increased, whereby an allowable value of the resistance of the ground wiring is made large. As the size of the electrostatic discharge protecting circuit is increased, however, routing a wiring other than the LSI ground wiring or its resistance are affected, and a significant restriction occurs with layout and design of external connecting terminals (pin). Such problem occurs similarly in an LSI in which a thick oxide element is used.

As described above, in a conventional LSI in which the ground line separation technique and a plurality of power supply systems of different power supply systems are employed, due to a voltage drop across the resistance caused when a surge current flows through the ground line, a potential difference between the internal signal transmitting portions between the power supply system circuits increases, and thus, the input gate of the internal circuit is broken down.

BRIEF SUMMARY OF THE INVENTION

According to an aspect of the present invention, there is provided a semiconductor integrated circuit apparatus comprising:
a plurality of power supply system circuits, in which power supply terminals or ground terminals, or the power supply terminals and the ground terminals, are separated from each other between the power supply system circuits;
an electrostatic discharge protecting circuit connected between a power supply terminal and a ground terminal of each of the power supply system circuits;
an internal circuit provided in each of the power supply system circuits;
an internal signal transmitting line which transmits a signal from an internal circuit of a first power supply system circuit of the power supply system circuits to an internal circuit of a second power supply system circuit of the power supply system circuits;
a surge input detecting circuit which detects a surge input to at least one of the power supply terminals; and
at least one of an input protecting circuit which is provided at an input side of the internal circuit and which limits a voltage of a signal transmitted from the internal signal transmitting line, and an output logic setting circuit which is provided at an output side of the internal circuit and which sets a logic level of a signal outputted to the internal signal transmitting line to a predetermined level when the surge input detecting circuit has detected a surge input.

According to another aspect of the present invention, there is provided a semiconductor integrated circuit apparatus comprising:
first and second power supply system circuits, in which power supply terminals or ground terminals, or the power supply terminals and the ground terminals, are separated from each other between the first and second power supply system circuits;
a common ground line connected in direct to the ground terminal of the first power supply system circuit and connected via a separate ground coupling circuit to the ground terminal of the second power supply system circuit;
an electrostatic discharge protecting circuit connected between a power supply terminal and a ground terminal of each of the power supply system circuits;
an internal circuit provided in each of the power supply system circuits;
a first internal signal transmitting line which transmits a signal from the internal circuit of the first power supply system circuit to the internal circuit of the second power supply system circuit;
a second internal signal transmitting line which transmits a signal from the internal circuit of the second power supply system circuit to the internal circuit of the first power supply system circuit;
a surge input detecting circuit which is provided in at least one of the first and second power supply system circuits and detects a surge input to the at least one of the first and second power supply system circuits;
at least one of a first input protecting circuit which is provided at an input side of the internal circuit of the first power supply system circuit and which limits a voltage of a signal transmitted from the second internal signal transmitting line, and a first output logic setting circuit which is provided at an output side of the internal circuit of the first power supply system circuit and which sets a logic level of a signal outputted to the first internal signal transmitting line to a predetermined level when the surge input detecting circuit has detected a surge input; and
at least one of a second input protecting circuit which is provided at an input side of the internal circuit of the second power supply system circuit and which limits a voltage of a signal transmitted from the first internal signal transmitting line, and a second output logic setting circuit which is provided at an output side of the internal circuit of the second power supply system circuit and which sets a logic level of a signal outputted to the second internal signal transmitting line to a predetermined level when the surge input detecting circuit has detected a surge input.

According to a further aspect of the present invention, there is provided a semiconductor integrated circuit apparatus comprising:
first, second and third power supply system circuits, in which power supply terminals or ground terminals, or the power supply terminals and the ground terminals, are separated from each other between the first, second and third power supply system circuits;
a common ground line connected to the ground terminals of the first, second and third power supply system circuits in direct or via a separate ground coupling circuit;
an electrostatic discharge protecting circuit connected between a power supply terminal and a ground terminal of each of the power supply system circuits;
an internal circuit provided in each of the first and second power supply system circuits;
a first internal signal transmitting line which transmits a signal from the internal circuit of the first power supply system circuit to the internal circuit of the second power supply system circuit;
a second internal signal transmitting line which transmits a signal from the internal circuit of the second power supply system circuit to the internal circuit of the first power supply system circuit;
a surge input detecting circuit which is provided in the third power supply system circuit and detects a surge input to the third power supply system circuit;
at least one of an input protecting circuit which is provided at an input side of the internal circuit of the first power supply system circuit and which limits a voltage of a signal transmitted from the second internal signal transmitting line, and an output logic setting circuit which is provided at an output side of the internal circuit of the first power supply system circuit and which sets a logic level of a signal outputted to the first internal signal transmitting line to a predetermined level when the surge input detecting circuit has detected a surge input; and
at least one of an input protecting circuit which is provided at an input side of the internal circuit of the second power supply system circuit and which limits a voltage of a signal transmitted from the first internal signal transmitting line, and an output logic setting circuit which is provided at an output side of the internal circuit of the second power supply system circuit and which sets a logic level of a signal outputted to the second internal signal transmitting line to a predetermined level when the surge input detecting circuit has detected a surge input.

BRIEF DESCRIPTION OF THE SEVERAL VIEWS OF THE DRAWING

FIG. 13 is a block diagram of a semiconductor integrated circuit apparatus according to a third embodiment of the present invention, for explaining an operation in which a gate break down of a MOS element is prevented when a surge current flows;

FIG. 14 is a block diagram of a semiconductor integrated circuit apparatus according to a fourth embodiment of the present invention, for explaining an operation in which a gate break down of a MOS element is prevented when a surge current flows;

FIG. 15 is a block diagram of a semiconductor integrated circuit apparatus according to a fifth embodiment of the present invention, for explaining an operation in which a gate break down of a MOS element is prevented when a surge current flows;

FIG. 17 is a block diagram showing an example in which, when each signal transmitter/receiver circuit group is assumed to be a 2-system circuit with respect to an LSI in which "n" power supply systems are provided, any the fifth embodiment is applied;

FIG. 18 is a block diagram of a semiconductor integrated circuit apparatus according to a sixth embodiment of the present invention, for explaining an operation in which a gate break down of a MOS element is prevented when a surge current flows.

DETAILED DESCRIPTION OF THE INVENTION

The present invention is applied to an LSI using a plurality of power supply systems, in which power supply terminals or ground terminals are separated between the power supply systems, or alternatively, both power supply terminals and ground terminals are separated between the power supply systems.

Embodiments of the present invention will be described hereinafter in detail with reference to the accompanying drawings.

In the following embodiments, a plurality of pads are formed on a same semiconductor chip (LSI chip). In the case where the semiconductor chip is packaged, the pads are connected to a plurality of external connecting terminals (e.g., pins and bump electrodes) of a semiconductor device.

Figure 1:
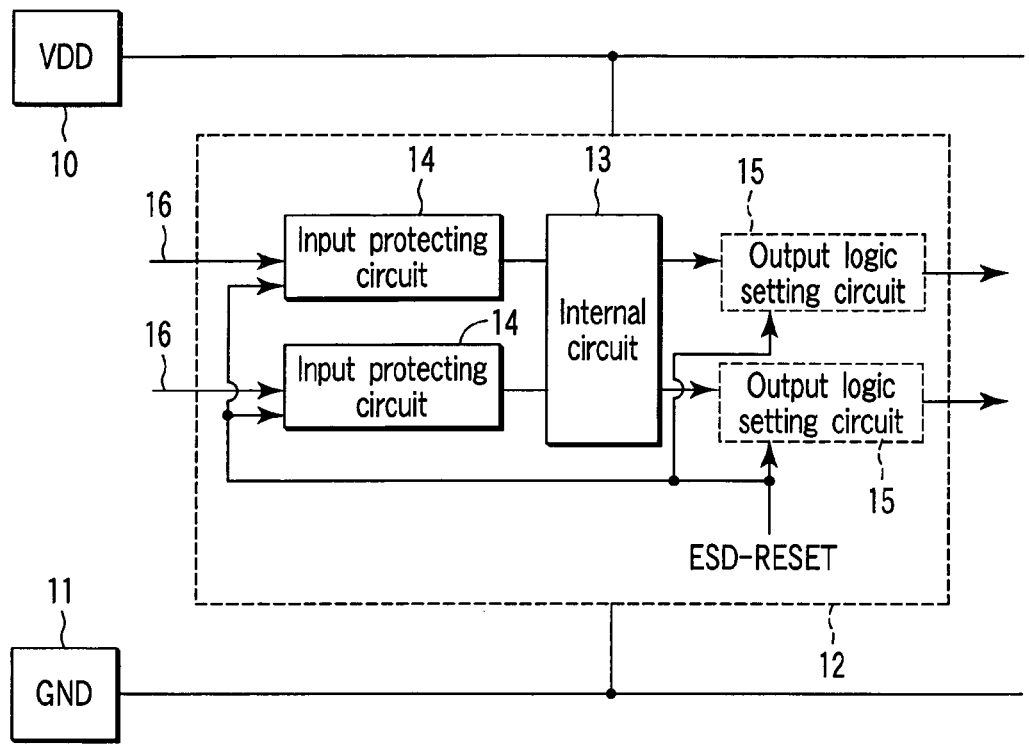
FIG. 1 is a block diagram schematically depicting a portion of a CMOS LSI.

FIG. 1 is a schematic block diagram depicting a circuit portion of a CMOS LSI, and schematically shows a connection relationship of internal circuits, input protecting circuits connected to input sides of the internal circuits, and output logic setting circuits connected to output sides of the internal circuits.

In FIG. 1, reference numeral 10 denotes a VDD pad applied with a power supply potential VDD in a normal operation mode, and reference numeral 11 denotes a GND pad applied with a ground potential GND. A power supply system circuit 12 is connected between a power supply line connected to the power supply pad VDD and a ground line connected to the ground pad GND. The power supply system circuit 12 comprises a plurality of internal circuits (in FIG. 1, two internal circuits) 13, input protecting circuits 14 connected to input sides of the internal circuits 13, and output logic setting circuits 15 connected to output sides of the internal circuits 13.

Each of the internal circuits 13 includes an input circuit which is inputted with a signal from an internal circuit of a power supply system circuit 12 of another power supply system via an internal signal transmitting line (boundary signal transmitting line) 16. Each of the internal circuits 13 also includes an output circuit which outputs a signal to an internal circuit of a power supply system circuit 12 of a further power supply system via another internal signal transmitting line 16. Each of the input protecting circuit 14 uses, for example, a voltage limiting circuit that limits an input voltage level. A reset signal ESD-RESET is applied to each of the output logic setting circuits 15. The reset signal ESD-RESET is generated when a surge input has been detected by a surge input detecting circuit (not shown).

Each of the input protecting circuits 14 prevents a MOS element in an input circuit with which the input protecting circuit 14 is associated from being broken down, when a potential of a power supply system the input circuit belongs becomes higher than that of a power supply system to which an output circuit which is at a signal send-out side belongs (i.e., when a signal having a lower level than a ground level is received). The reset signal ESD-RESET may not be supplied to the input protecting circuit 14, and specific examples will be described later.

Each of the output logic setting circuits 15 is also prevents a MOS element in an input circuit at a signal receipt side from being broken down, when a potential of a power supply system to which an output circuit associated with the output logic setting circuits 15 belongs becomes higher than that of a power supply system to which the input circuit at the signal receive side belongs, by lowering the potential of an output signal outputted from the output circuit.

Some specific examples of the output logic setting circuit 15 will be described later. In addition, some specific examples of the surge input detecting circuit, which generates the reset signal ESD-RESET when a surge input has been detected, will also be described later.

In the following description, a signal for resetting the input protecting circuit 14 or output logic setting circuit 15 upon detection of a surge input is referred to as a reset signal ESD-RESET. Also, a signal becoming a high level "H" is referred to as ERESETB, and a signal becoming a low level "L" is referred to as ERESET, when ESD-RESET is active (in a reset state).

<Specific Example 1 of Input Protecting Circuit>

Figure 2:
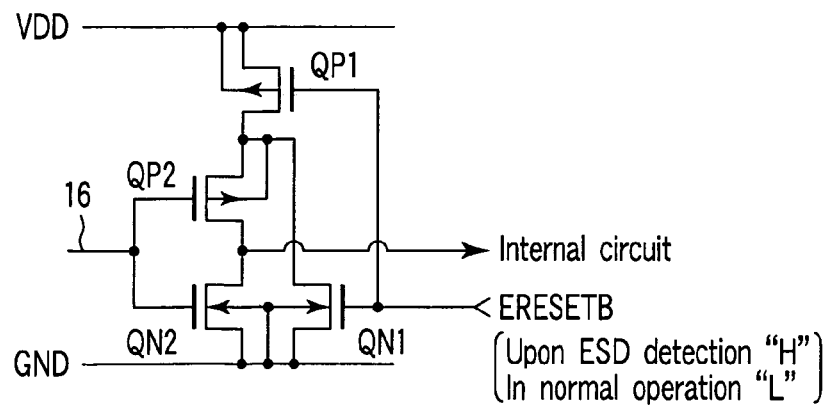
FIG. 2 is a circuit diagram showing a specific example of an input protecting circuit in the CMOS LSI of FIG. 1.

FIG. 2 shows a specific example 1 of the input protecting circuit 14 in FIG. 1. The input protecting circuit 14 in FIG. 1 comprises a first PMOS transistor QP1 and a first NMOS transistor QN1 connected in series between a power supply line VDD and a ground line GND. The substrate and source of the first PMOS transistor QP1 are connected to the power supply line VDD. The substrate and source of the first NMOS transistor QN1 are connected to the ground line GND. The gates of the first PMOS transistor QP1 and first NMOS transistors QN1 are interconnected. The input protecting circuit 14 further comprises a second PMOS transistor QP2 and a second NMOS transistor QN2 connected in series between the drain of the first PMOS transistor and the ground line GND. The substrate and source of the second PMOS transistor QP2 are connected to the drain of first PMOS transistor QP1. The substrate and source of the second NMOS transistor QN2 are connected to the ground line GND. The gates of the second PMOS transistor QP2 and the second NMOS transistors QN2 are interconnected.

The junction node of the gates of the first PMOS transistor QP1 and the first NMOS transistor QN1 are connected to a reset signal line to which a reset signal ERESETB. The junction node (i.e., an input node) of the gates of the second PMOS transistor QP2 and the second transistor QN2 are connected to an internal signal transmitting line 16. The junction node (i.e., an output node) of the drains of the second PMOS transistor QP2 and the second transistor QN2 are connected to an input node of an internal circuit.

In the structure of the circuit as described above, in the normal operation, the first PMOS transistor QP1 is turned ON by ERESTEB="L", and the first NMOS transistor QN1 is turned OFF. Thus, the second PMOS transistor QP2 and the second NMOS transistor QN2 function as an inverter circuit.

When a surge is inputted, if a voltage of the power supply line VDD is, for example, 12 V, a voltage of the ground line GND is, for example, 6 V, and an input signal from the internal signal transmitting line 16 is 0 V, the first PMOS transistor QP1 is reversed to OFF by ERESETB="H", and the first NMOS transistor QN1 is reversed to ON. In this manner, the potential of the source and substrate region of the second PMOS transistor QP2 become GND. In this state, a voltage of 6 V is applied to a gate oxide of any element of the input protecting circuit.

The input protecting circuit shown in FIG. 2 is a circuit having a function of an inverter and a function of an element protecting circuit by ERESETB. When the surge input detecting circuit has detected a surge input, the potential of the source and the substrate of the PMOS transistor QP2 are set at GND potentials of a power supply system circuit to which the PMOS transistor QP2 belong, and in all of the elements of the input protecting circuit, a voltage to be applied to the gate oxide (i.e., a voltage between the gate and the source, a voltage between the gate and drain, and a voltage between the gate and the substrate) is limited, and the break down of the elements is prevented. Conventionally, 12 V is applied to the gate oxide in general, and thus in the case where the gate breakdown voltage is 6 V, the element is break down. However, in this example, in the case where the gate breakdown voltage is 6 V, since only 6 V is applied, no break down occurs.

<Specific Example 1 of Surge Input Detecting Circuit>

Figure 3:
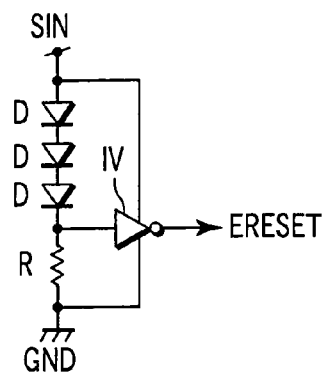
FIG. 3 is a circuit diagram showing a specific example 1 of a surge input detecting circuit (a level detection type circuit) in the CMOS LSI of FIG. 1.

FIG. 3 shows a level detection type surge input detecting circuit. In this surge input detecting circuit, any number of forward direction connected diodes D (in this example, three diodes) and a resistor element R are connected in series between an ESD application node SIN (i.e., a terminal or a wiring) to which an ESD is applied and a ground line. An input node of an inverter circuit IV is connected to the junction node of the diodes D and the resistor element R. An output signal of the inverter circuit IV is supplied as the reset signal ERESET.

In a normal state, assuming that a voltage of the ESD application node SIN is, for example, 1.5V, a voltage in the forward direction is insufficient in each of the diodes D, and the diodes D are turned OFF. In addition, the input node of the inverter circuit IV is set to ground potential, i.e., "L", and the output signal ERESET is set to "H". When an ESD is applied, if a voltage of the ESD application node increases, the diodes D are turned ON. The input node of the inverter circuit IV is set to "H", and the output signal ERESET is set to "L".

A threshold voltage Vth of the surge input detecting circuit is greater than an LSI power supply voltage and smaller than a gate breakdown voltage of an element targeted for protection.

<Specific Example 2 of Surge Input Detecting Circuit>

Figure 4:
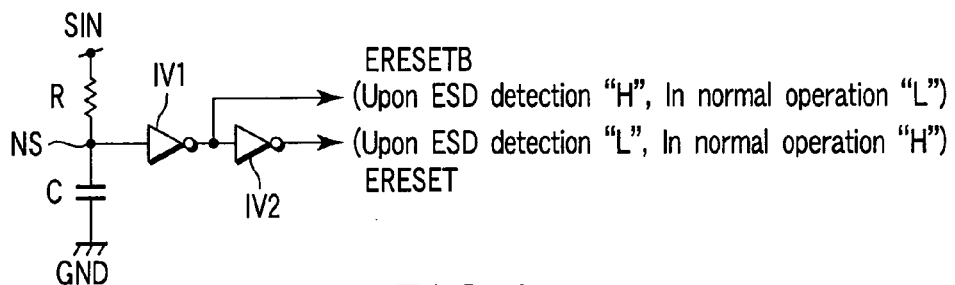
FIG. 4 is a circuit diagram showing a specific example 2 of a surge input detecting circuit (a delay type circuit) in the CMOS LSI of FIG. 1.

FIG. 4 shows a delay type surge input detecting circuit. In this surge input detecting circuit, a resistor element R and a capacitor element C are connected in series between a node SIN (i.e., a terminal or a wiring) to which a surge is applied and a ground line. An input node of a first inverter circuit IV1 is connected to the junction node NS of the resistor element R and the capacitor element C. An input node of a second inverter circuit IV2 is connected to an output node of the first inverter circuit IV1. Output signals ERESETB and ERESET of these two stage inverter IV1 and IV2 are used as complementary reset signals. The output signal ERESETB of the inverter circuit IV1 is set to "H" upon detection of a surge input, and is set to "L" in the normal state. The output signal ERESET of the inverter circuit IV2 is set to "L" in upon detection of a surge input, and is set to "H" in the normal state.

In the above circuit configuration, assume that in an initial state, the potential of the RC junction node NS is equal to GND potential. When a surge input has been applied and a potential of the node SIN rises, an input potential of the inverter circuit IV1 changes from GND potential to follow a change of the potential of the node SIN. The speed of such a change depends on a time constant of RC. In the normal state, the input potential of the inverter circuit IV1 is equal to the potential of the node SIN. Thus, the output signal ERESETB of the inverter circuit IV1 is set to "L", and the output signal ERESET of an inverter circuit IV2 is set to "H". When a surge is inputted, the potential of the node NS increases for a short time as compared with the time constant of RC. The output signal ERESETB of the inverter circuit IV1 is set to "H", and the output signal ERESET of the inverter circuit IV2 is set to "L". In consideration of a surge input time (i.e., a period of time of a surge input), the time constant of RC is set so that, during surge input time, the output signal ERESETB of the inverter circuit IV1 is set to "H" and the output signal ERESET of the inverter circuit IV2 is set to "L".

<Specific Example 3 of Surge Input Detecting Circuit>

Figure 5:
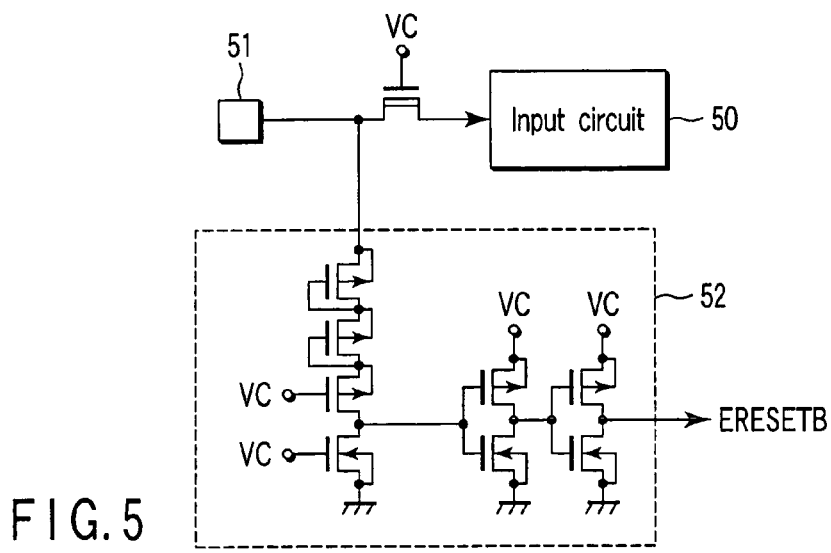
FIG. 5 is a circuit diagram showing a specific example 3 of a surge input detecting circuit (a high voltage detection type circuit) in the CMOS LSI of FIG. 1.

A high voltage detecting circuit shown in FIG. 5 is disclosed in Jpn. Pat. Appln. KOKAI Publication No. 6-95545. When an input signal of a normal operation level is inputted to an external terminal 51, an input circuit 50 detects the input signal. On the other hand, for example, when a high voltage greater than the normal operation level is inputted in the test mode, a high voltage detecting circuit 52 detects the high voltage. When an ESD is applied, it is possible to detect the ESD by a high voltage detecting circuit 52. A detection output of the high voltage detecting circuit 52 may be used as the reset signal ERESETB.

The input protecting circuit 14 is not limited to a circuit as shown in FIG. 1, which requires the reset signal ESD-RESET. Instead, a voltage limiting circuit of such a type, which does not require a reset signal as shown in, for example, FIG. 6, FIG. 7 or FIG. 8.

<Specific Example 2 of Input Protecting Circuit>

Figure 6:
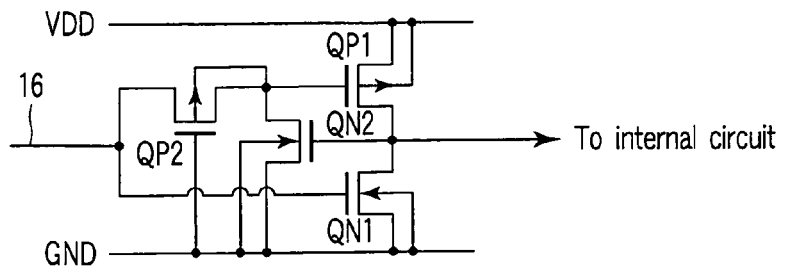
FIG. 6 is a circuit diagram showing a specific example 2 of an input protecting circuit in the CMOS LSI of FIG. 1.

FIG. 6 shows specific example 2 of the input protecting circuit shown in FIG. 1, which does not require a reset signal. This input protecting circuit comprises a first PMOS transistor QP1 and a first NMOS transistor QN1 connected in series between a power supply line VDD and a ground line GND. The substrate and source of the first PMOS transistor QP1 are connected to the power supply line VDD. The substrate and source of the first NMOS transistor QN1 are connected to the ground line GND. A gate of the first NMOS transistors QN1 is connected to an input node to which a signal is inputted via an internal signal transmitting line 16.

The input protecting circuit 14 further comprises a second PMOS transistor QP2 and a second NMOS transistor QN2. The source-drain path of the second PMOS transistor QP2 is connected between the input node and a gate of the first PMOS transistor QP1. The substrate and source of the second PMOS transistor QP2 are interconnected, and the gate of the second PMOS transistor QP2 is connected to the ground line. Further, the drain-source path of the second NMOS transistor QN2 is connected between the gate of the first PMOS transistor QP1 and the ground line. The substrate and source of the second NMOS transistor QN2 are interconnected, and a gate of the second NMOS transistor QN2 is connected to the drain junction node (i.e., output node) of the first PMOS transistor QP1 and the first NMOS transistor QN1.

In the structure of the circuit as described above, in the initial state, when an input signal inputted from via the internal signal transmitting line 16 is "H", the second PMOS transistor QP2 is ON, the gate of the first PMOS transistor QP1 is "H", the first PMOS transistor QP1 is OFF, the first NMOS transistor QN1 is ON, and the output node is "L".

In the normal state, the first PMOS transistor QP1 and the first NMOS transistor QN1 function as an inverter circuit. When the input signal inputted from via the internal signal transmitting line 16 is changed to "L", the first NMOS transistor QN1 is turned OFF, and the potential of the gate of the first PMOS transistor QP1 is lowered and the potential of the output node is increased. In accordance therewith, the second NMOS transistor QN2 is turned ON, and the potential of the gate of the first PMOS transistor QP1 is changed to "L", and the potential of the output node is changed to "H".

On the other hand, when the input signal inputted from via the internal signal transmitting line 16 is changed to "H", the first NMOS transistor QN1 is ON, and the potential of the gate of the first PMOS transistor QP1 is increased and the potential of the output node is decreased. In accordance therewith, the second NMOS transistor QN2 is turned OFF, and the potential of the output node is changed to "L".

When a surge is inputted, if a voltage of the power supply line VDD is, for example, 12 V, a voltage of the ground line GND is, for example, 6 V, and an input signal from the internal signal transmitting line 16 is 0 V, the first NMOS transistor QN1 is turned OFF, and the gate potential of the first PMOS transistor QP1 is lowered. As a result, the potential of the gate of the first PMOS transistor QP1 is equal to GND, and the potential of the output node is equal to VDD, by a positive feedback circuit comprised of the first PMOS transistor QP1 and the second NMOS transistor QN2. In this state, a voltage of 6 V is applied to a gate oxide of any element of the input protecting circuit.

The input protecting circuit as shown in FIG. 6, which does not require a reset signal, is a circuit having a function of an inverter and a function of an element protecting circuit. When a potential lower than GND potential is inputted, the potential of the source and the substrate of the PMOS transistor QP2 are set at GND potentials of a power supply system circuit to which the PMOS transistor QP2 belong, and in all of the elements of the input protecting circuit, a voltage to be applied to the gate oxide (i.e., a voltage between the gate and the source, a voltage between the gate and drain, and a voltage between the gate and the substrate) is limited, and the break down of the elements is prevented. Conventionally, 12 V is applied to the gate oxide, and thus in the case where the gate breakdown voltage is 6 V, the element is break down. However, in this example, since only 6 V is applied, no break down occurs.

<Specific Example 3 of Input Protecting Circuit>

Figure 7:
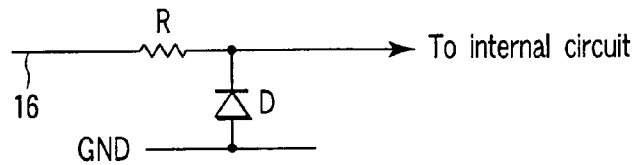
FIG. 7 is a circuit diagram showing a specific example 3 of an input protecting circuit in the CMOS LSI of FIG. 1.

FIG. 7 shows specific example 3 of the input protecting circuit shown in FIG. 1, which does not require a reset signal.

In this surge input detecting circuit, a current limiting resistor element R is connected between an input node to which a signal is inputted via the internal signal transmitting line 16 and an output node from which the singal is outputted to an internal circuit. A diode D is connected in the forward direction between a ground line GND and the output node.

In the circuit structure as described above, in the normal state, the diode D is turned off, since it is biased in the reverse direction. When a surge is inputted, if a voltage of the ground line GND is, for example, 6 V, and an input signal from the internal signal transmitting line 16 is 0 V, the diode D is biased in the forward direction. As a result, a potential at the junction node (an output node) between the resistor element R and the diode D is set to 5 V which is reduced from 6 V by a forward direction voltage VF (about 1 V) of the diode D. Then, a potential of the output node with respect to GND is limited to −1 V.

In this example of the input protecting circuit, the signal transmission speed is reduced by the resistor element R and a parasitic capacitance of the diode D. The input protecting circuit in this example is more suitable to a low speed signal than those in examples 1 and 2.

<Specific Example 4 of Input Protecting Circuit>

Figure 8:
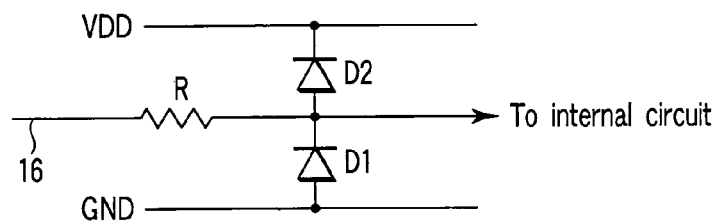
FIG. 8 is a circuit diagram showing a specific example 3 of an input protecting circuit in the CMOS LSI of FIG. 1.

FIG. 8 shows specific example 4 of the input protecting circuit shown in FIG. 1, which does not require a reset signal.

In this surge input detecting circuit, a current limiting resistor element R is connected between an input node to which a signal is inputted via the internal signal transmitting line 16 and an output node from which the singal is outputted to an internal circuit. A first diode D1 is connected in the forward direction between a ground line GND and the output node. A second diode D2 is connected in the forward direction between the output node and a power supply line VDD.

In the circuit structure as described above, in the normal state, the diodes D1 and D2 are turned off, since these diodes are biased in the reverse direction.

When a surge is inputted, if a voltage of the ground line GND is, for example, 6 V, and an input signal from the internal signal transmitting line 16 is 0 V, the first diode D1 connected between the ground line GND and the output node is biased in the forward direction. As a result, a potential at the junction node (an output node) between the resistor element R and the diodes D1 and D2 is set to 5 V which is reduced from 6 V by a forward direction voltage VF (about 1 V) of the first diode D1. Then, a potential of the output node with respect to GND is limited to −1 V.

On the other hand, when a surge is inputted, if a voltage of the power supply line VDD is, for example, 0 V, and an input signal from the internal signal transmitting line 16 is 6 V, the second diode D2 connected between the output node and the power supply line VDD is biased in the forward direction. As a result, a potential of the output node is set to 1 V which is increased from 0 V by a forward direction voltage VF (about 1 V) of the second diode D2, and a potential of the output node with respect to VDD is limited to 1 V.

<Specific Example 4 of Surge Input Detecting Circuit>

Figure 9:
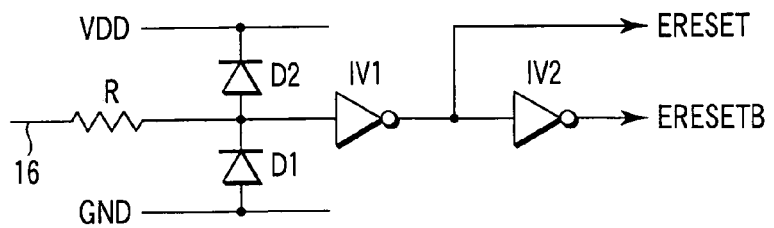
FIG. 9 is a circuit diagram showing a specific example 4 of the surge input detecting circuit in the CMOS LSI of FIG. 1 (a detecting circuit for cross-referencing a potential of a power supply terminal)

In a surge input detecting circuit shown in FIG. 9, a current limiting resistor element R and a first diode D1 in a reverse direction are connected in series between an input node and GND. In addition, a second diode D2 is connected in the reverse direction between a VDD node of a power supply system circuit to which the surge input detecting circuit belongs and the junction node between the resistor element R and the first diode D1. A potential of the junction node between the resistor element R and the first diode D1 is wave-shaped by the two-stage inverter circuits IV1 and IV2 to generate complementary reset signals ERESET and ERESETB.

<Specific Example of Output Logic Setting Circuit>

In the output logic setting circuit 15 shown in FIG. 1, an output signal from an internal circuit corresponding to the output logic setting circuit 15 is forcibly set to "L" upon detection of a surge input, thereby limiting an input voltage level to an internal circuit of a power supply system at the succeeding stage, to which the output signal is supplied.

That is, the output logic setting circuit 15 carries out the normal operation when the reset signal ESD-RESET is not active. When the reset signal ESD-RESET is active (in the time of a surge input), the output signal is fixed to "L".

Figure 10:
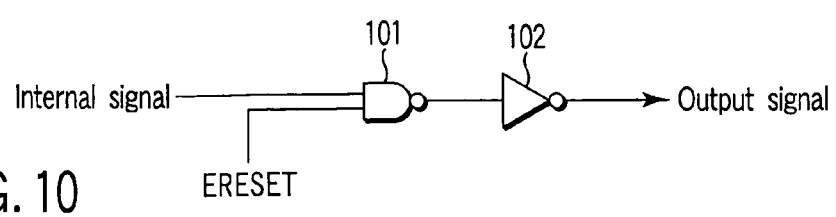
FIG. 10 is a circuit diagram showing a specific example of an output logic setting circuit in the CMOS LSI of FIG. 1.

FIG. 10 shows an example of the output logic setting circuit 15 shown in FIG. 1. This output logic setting circuit is an AND gate circuit including a two-input NAND gate circuit 101 which is inputted with a signal from a corresponding internal circuit and a reset signal ERESET and an inverter circuit 102 which inverts and outputs an output signal of the NAND gate circuit 101.

This output logic setting circuit carries out the normal operation when the reset signal ERESET is set at "H", and the signal of the internal circuit is outputted via the NAND gate circuit 101 and the inverter circuit 102. When the reset signal ERESET is set at "L", the output signal of the NAND gate circuit 101 is set to "H", and the output signal of the inverter circuit 102 is fixed to "L".

According to the LSI above described, the input protecting circuit 14 and the output logic setting circuit 15 are connected to an internal circuit of each of the power supply systems. Thus, as described later in detail, the internal circuit of each power supply system can be easily protected from a surge input. In addition, in the case where the ground line of each power supply system is separated by, for example, a back to back diode, it becomes unnecessary to ensure a large allowable value of a resistance component of the ground line by increasing the size of the electrostatic discharge protecting circuit, and a restriction for the allowable value of the resistance component of the ground line is alleviated. Further, a limit value of a potential difference between different power supplies is alleviated, making it possible to reduce the size of a voltage clamping element connected to each power supply system.

First Embodiment

Figure 11:
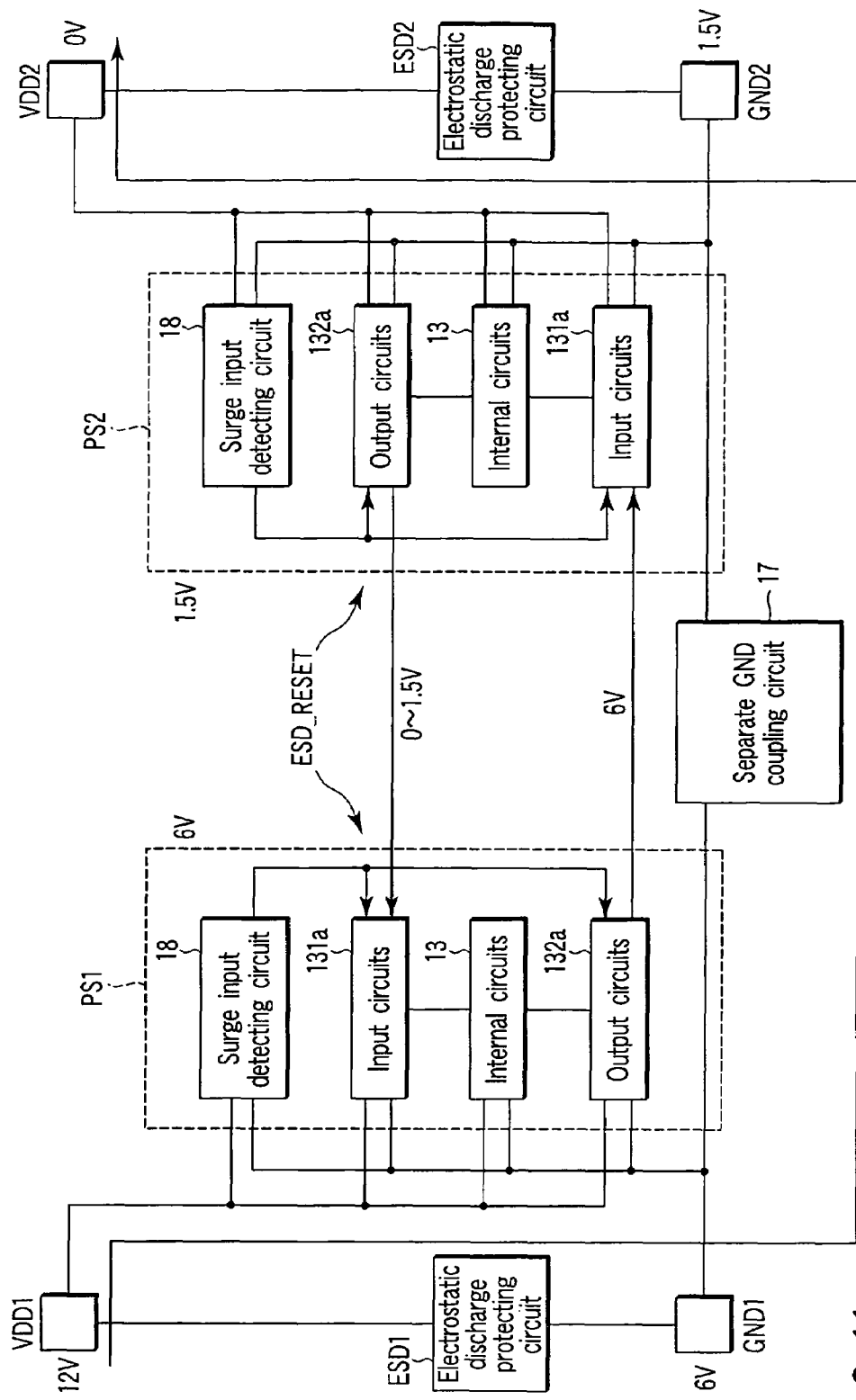
FIG. 11 is a block diagram of a semiconductor integrated circuit apparatus according to a first embodiment of the present invention, for explaining an operation in which a gate break down of a MOS element is prevented when a surge-current flows.

FIG. 11 is a block diagram of an LSI using a ground line separation technique and two power supplies, according to a first embodiment of the present invention, in which each of two power supply system circuits comprises a surge input detecting circuit for detecting a surge input to a power supply terminal of the power supply system circuit. Hereinafter, an example in which a gate breakdown of an element is prevented according to this embodiment, is described. In this example, a gate breakdown of a MOS element is prevented when a surge is inputted to a power supply terminal of one of two power supply system circuits, and then, a surge current flows toward a power supply terminal of the other of the power supply system circuits.

In the LSI shown in FIG. 11, when a surge has been applied and a maximum surge current IESDMAX flows from a power supply terminal VDD1 of a first power supply system circuit PS1 to a power supply terminal VDD2 (=0 V) of a second power supply system circuit PS2 through an electrostatic discharge protecting circuit ESD1 of the first power supply system circuit PS1, a separate GND coupling circuit 17, and an electrostatic discharge protecting circuit ESD2 of the second power supply system circuit PS2, a potential of the power supply terminal VDD1 of the first power supply system circuit PS1 is 12 V, a potential of a ground terminal GND1 of the first power supply system circuit PS1 is 6 V, and a potential of a ground terminal GND2 of the second power supply system circuit PS2 is 1.5 V. At this time, a voltage across the power supply terminal VDD1 and the ground terminal GND1 of the first power supply system circuit PS1 is 6 V, and a voltage across the power supply terminal VDD2 and the ground terminal GND2 of the second power supply system circuit PS2 is −1.5 V, and a surge input detecting circuit 18 of the first power supply system circuit PS1 outputs an active ESD-RESET signal. That is, the potential of 6 V of the ground terminal GND1 of the first power supply system circuit PS1 is outputted as a "L" level signal RESET, and the potential of 12 V of the power supply terminal VDD1 of the first power supply system circuit PS1 is outputted as a "H" level signal ERESETB. The reset signal ESD-RESET is supplied to each of input protecting circuits corresponding to input circuits 131a of the first power supply system circuit PS1. The reset signal ESD-RESET is also supplied to each of output logic setting circuits corresponding to output circuits 132a of the first power supply system circuit PS1.

As a result, an output potential of the output logic setting circuits corresponding to output circuits 132a of the first power supply system circuit PS1 is fixed to 6 V, and an output potential of the output logic setting circuits corresponding to output circuits 132a of the second power supply system circuit PS2 is between 0 v and 1.5 V.

When the maximum surge current IESDMAX is a positive current and flows through the electrostatic discharge protecting circuit (i.e., when a positive maximum surge current IESDMAX flows from VDD to GND), a forward direction voltage of the electrostatic discharge protecting circuit is 6 V. On the other hand, when the maximum surge current IESDMAX is a negative current and flows through the electrostatic discharge protecting circuit (i.e., when a negative maximum surge current IESDMAX flows from GND to VDD), a reverse direction voltage of the electrostatic discharge protecting circuit is 1.5 V. A forward direction voltage and reverse direction voltage of the separate GND coupling circuit are 4.5 V. A gate breakdown voltage of MOS transistors is 6 V. These voltage values are merely examples for explanation, and the present invention is not limited to these voltage values.

When a surge has been applied and a maximum surge current IESDMAX flows from the power supply terminal VDD1 of the first power supply system circuit PS1 to the power supply terminal VDD2 (=0 V) of the second power supply system circuit PS2 through the route as described above, the maximum voltage applied to the input circuits 131a of the first power supply system circuit PS1 is 12 V. However, a protecting operation is carried out by the input protecting circuits provided corresponding to the input circuits 131a of the first power supply system circuit PS1. Thus, gates of MOS elements in the input circuits 131a of the first power supply system circuit PS1 are not broken down. In addition, the maximum voltage applied to the input circuits 131a of the second power supply system circuit PS2 is limited to 6 V, and thus, a voltage smaller than the gate breakdown voltage 6 V of MOS elements in the input circuits 131a of the second power supply system circuit PS2 is applied thereto. Therefore, the gates of these MOS elements are also not broken down.

Any of the above-described examples may be used as the input protecting circuit provided corresponding to the input circuits 131a shown in FIG. 11. That is, the input protecting circuit which requires a reset signal ESD-RESET may be used. Alternatively, the input protecting circuit which does not require a reset signal ESD-RESET may be used. In addition, a circuit with diodes D in a multi-stage manner, as shown in FIG. 3 or a circuit including a resistor R and a capacitor C, as shown in FIG. 4, is suitable for the surge input detecting circuit 18 shown in FIG. 11.

Each of the electrostatic discharge protecting circuits ESD1 and ESD2 is formed of, for example, a parallel connection circuit of a thyristor and a diode connected in parallel between VDD and GND, the thyristor is connected in the forward direction, and the diode is connected in the reverse direction. Alternatively, the electrostatic discharge protecting circuit is formed of, for example, an NMOS transistor whose drain is connected to VDD and whose source and gate are connected to GND.

The separate GND coupling circuit is formed of, for example, a parallel connection circuit of two diodes connected in parallel, one of the diodes is connected in the forward direction, and the other of the diodes is connected in the reverse direction. This connection scheme is referred to as "back-to-back connected diodes". Alternatively, the separate GND coupling circuit is formed of, for example, an NMOS transistor whose drain is connected to one terminal of the separate GND coupling circuit and whose source and gate are connected to the other terminal of the separate GND coupling circuit. Further alternatively, the separate GND coupling circuit is formed of, for example, a conductive material member (e.g., metal wiring).

Second Embodiment

Figure 12:
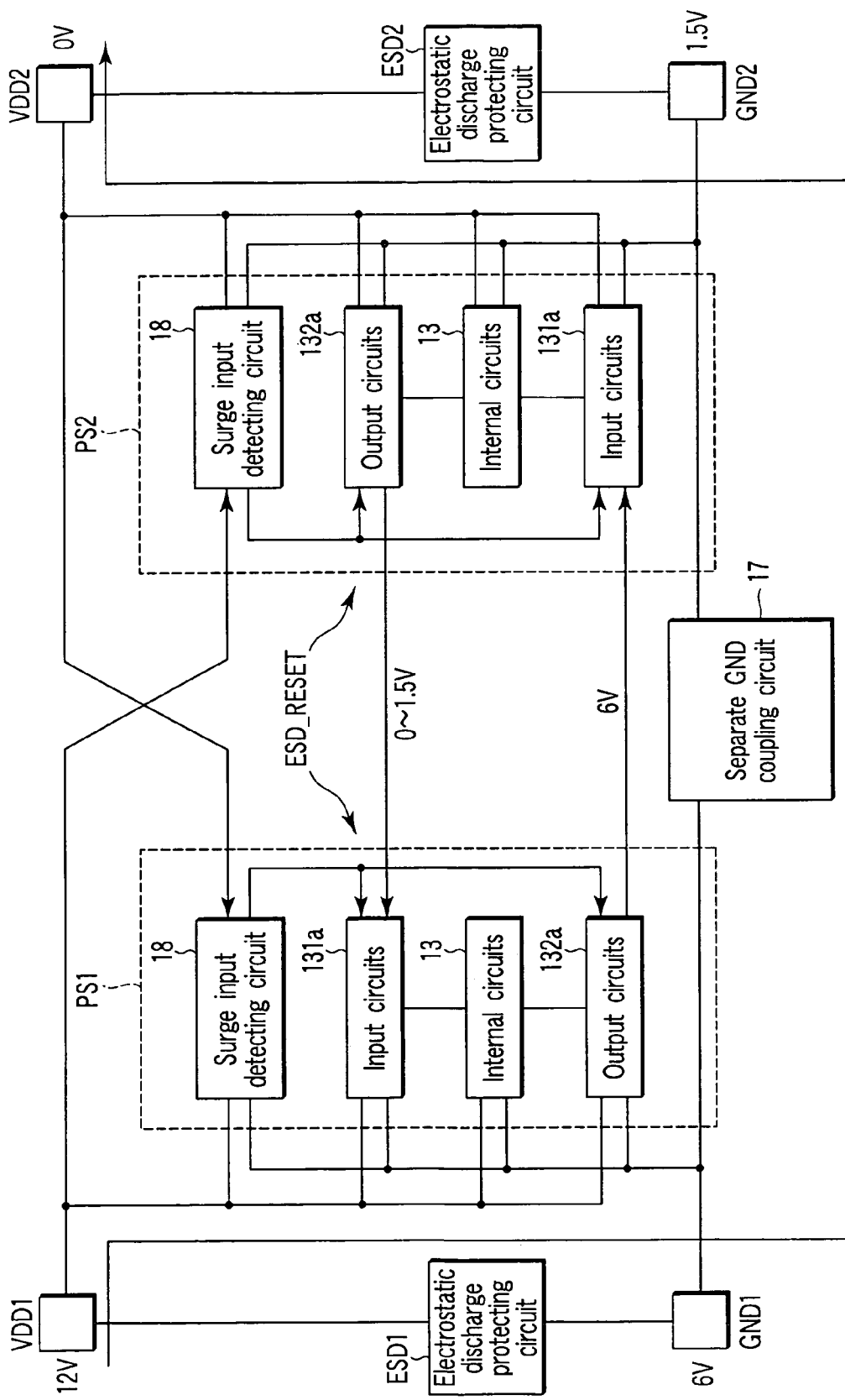
FIG. 12 is a block diagram of a semiconductor integrated circuit apparatus according to a second embodiment of the present invention, for explaining an operation in which a gate break down of a MOS element is prevented when a surge current flows.

FIG. 12 is a block diagram of an LSI using a ground line separation technique and two power supplies, according to a second embodiment of the present invention, in which each of two power supply system circuits comprises a surge input detecting circuit, and the surge input detecting circuits of the two power supply system circuits each detect a surge input to a power supply terminal of the power supply system circuit which includes the other surge input detecting circuit. Hereinafter, an example in which a gate breakdown of an element is prevented according to this embodiment, is described. In this example, a gate breakdown of a MOS element is prevented when a surge is inputted to a power supply terminal of one of two power supply system circuits, and then, a surge current flows toward a power supply terminal of the other of the power supply system circuits.

In the LSI shown in FIG. 12, when a surge has been applied and a maximum surge current IESDMAX flows from a power supply terminal VDD1 of a first power supply system circuit PS1 to a power supply terminal VDD2 (=0 V) of a second power supply system circuit PS2 through an electrostatic discharge protecting circuit ESD1 of the first power supply system circuit PS1, a separate GND coupling circuit 17, and an electrostatic discharge protecting circuit ESD2 of the second power supply system circuit PS2, a potential of the power supply terminal VDD1 of the first power supply system circuit PS1 is 12 V, a potential of a ground terminal GND1 of the first power supply system circuit PS1 is 6 V, and a potential of a ground terminal GND2 of the second power supply system circuit PS2 is 1.5 V. At this time, a voltage across the power supply terminal VDD1 and the ground terminal GND1 of the first power supply system circuit PS1 is 6 V, and a voltage across the power supply terminal VDD2 and the ground terminal GND2 of the second power supply system circuit PS2 is −1.5 V. Then, a surge input detecting circuit 18 of the first power supply system circuit PS1 detects that a negative surge has been applied from the power supply terminal VDD2=0 V of the second power supply system circuit PS2, which is lower than the ground terminal GND1=6 V of the first power supply system circuit PS1, and outputs an active ESD-RESET signal.

That is, the potential of 6 V of the ground terminal GND1 of the first power supply system circuit PS1 is outputted as a "L" level signal RESET, and the potential of 12 V of the power supply terminal VDD1 of the first power supply system circuit PS1 is outputted as a "H" level signal ERESETB. The reset signal ESD-RESET is supplied to each of input protecting circuits corresponding to input circuits 131a of the first power supply system circuit PS1. The reset signal ESD-RESET is also supplied to each of output logic setting circuits corresponding to output circuits 132a of the first power supply system circuit PS1.

As a result, an output potential of the output logic setting circuits corresponding to output circuits 132a of the first power supply system circuit PS1 is fixed to 6 V, the maximum voltage applied to the input circuits 131a of the second power supply system circuit PS2 is 6 V, and an output potential of the output logic setting circuits corresponding to output circuits 132a of the second power supply system circuit PS2 is between 0 v and 1.5 V.

When the maximum surge current IESDMAX is a positive current and flows through the electrostatic discharge protecting circuit (i.e., when a positive maximum surge current IESDMAX flows from VDD to GND), a forward direction voltage of the electrostatic discharge protecting circuit is 6 V. On the other hand, when the maximum surge current IESDMAX is a negative current and flows through the electrostatic discharge protecting circuit (i.e., when a negative maximum surge current IESDMAX flows from GND to VDD), a reverse direction voltage of the electrostatic discharge protecting circuit is 1.5 V. A forward direction voltage and reverse direction voltage of the separate GND coupling circuit are 4.5 V. A gate breakdown voltage of MOS transistors is 6 V. These voltage values are merely examples for explanation, and the present invention is not limited to these voltage values.

When a surge has been applied and a maximum surge current IESDMAX flows from the power supply terminal VDD1 of the first power supply system circuit PS1 to the power supply terminal VDD2 (=0 V) of the second power supply system circuit PS2 through the route as described above, a protecting operation is carried out by the input protecting circuits provided corresponding to the input circuits 131a of the first power supply system circuit PS1. Thus, gates of MOS elements in the input circuits 131a of the first power supply system circuit PS1 are not broken down. In addition, the maximum voltage applied to input circuits 131a of the second power supply system circuit PS2 is limited to 6 V, and thus, the gates of the MOS elements in the input circuits 131a of the second power supply system circuit PS2 are also not broken down.

Any of the examples as described may be used as the input protecting circuit provided corresponding to the input circuits 131a shown in FIG. 12. That is, the input protecting circuit which requires a reset signal ESD-RESET may be used. Alternatively, the input protecting circuit which does not require a reset signal ESD-RESET may be used. In addition, a circuit including a resistor element R and diodes D, as shown in, for example, FIG. 9 is suitable for the surge input detecting circuit 18 shown in FIG. 12.

Each of the electrostatic discharge protecting circuits ESD1 and ESD2 is formed of, for example, a parallel connection circuit of a thyristor and a diode connected in parallel between VDD and GND, the thyristor is connected in the forward direction, and the diode is connected in the reverse direction. Alternatively, the electrostatic discharge protecting circuit is formed of, for example, an NMOS transistor whose drain is connected to VDD and whose source and gate are connected to GND.

The separate GND coupling circuit is formed of, for example, a parallel connection circuit of two diodes connected in parallel, one of the diodes is connected in the forward direction, and the other of the diodes is connected in the reverse direction. Alternatively, the separate GND coupling circuit is formed of, for example, an NMOS transistor whose drain is connected to one terminal of the separate GND coupling circuit and whose source and gate are connected to the other terminal of the separate GND coupling circuit. Further alternatively, the separate GND coupling circuit is formed of, for example, a conductive material member (e.g., metal wiring).

Third Embodiment

FIG. 13 is a block diagram of an LSI using a ground line separation technique and two power supplies, according to a third embodiment of the present invention, in which only one of two power supply system circuits comprises a surge input detecting circuit for detecting a surge input to a power supply terminal of the power supply system circuit. Hereinafter, an example in which a gate breakdown of an element is prevented according to this embodiment, is described. In this example, a gate breakdown of a MOS element is prevented when a surge is inputted to a power supply terminal of one of two power supply system circuits, and then, a surge current flows toward a power supply terminal of the other of the power supply system circuits.

In the LSI shown in FIG. 13, when a surge has been applied and a maximum surge current IESDMAX flows from a power supply terminal VDD1 of a first power supply system circuit PS1 to a power supply terminal VDD2 (=0 V) of a second power supply system circuit PS2 through an electrostatic discharge protecting circuit ESD1 of the first power supply system circuit PS1, a separate GND coupling circuit 17, and an electrostatic discharge protecting circuit ESD2 of the second power supply system circuit PS2, a potential of the power supply terminal VDD1 of the first power supply system circuit PS1 is 12 V, a potential of a ground terminal GND1 of the first power supply system circuit PS1 is 6 V, and a potential of a ground terminal GND2 of the second power supply system circuit PS2 is 1.5 V. At this time, a voltage across the power supply terminal VDD1 and the ground terminal GND1 of the first power supply system circuit PS1 is 6 V, and a voltage across the power supply terminal VDD2 and the ground terminal GND2 of the second power supply system circuit PS2 is −1.5 V, and a surge input detecting circuit 18 of the first power supply system circuit PS1 outputs an active ESD-RESET signal. That is, the potential of 6 V of the ground terminal GND1 of the first power supply system circuit PS1 is outputted as a "L" level signal ERESET, and the potential of 12 V of the power supply terminal VDD1 of the first power supply system circuit PS1 is outputted as a "H" level signal ERESETB. The reset signal ESD-RESET is supplied to each of input protecting circuits corresponding to input circuits 131a of the first power supply system circuit PS1. The reset signal ESD-RESET is also supplied to each of output logic setting circuits corresponding to output circuits 132a of the first power supply system circuit PS1.

Furthermore, the reset signal ESD-RESET is supplied to each of input protecting circuits corresponding to input circuits 131a of the second power supply system circuit PS2. The reset signal ESD-RESET is also supplied to each of output logic setting circuits corresponding to output circuits 132a of the second power supply system circuit PS2. However, at this time, the input circuits 131a and output circuits 132a of the second power supply system circuit PS2 are at a non-operation state because of the power supply voltage being negative, and the reset signal ESD-RESET input is invalid.

As a result, an output potential of the output logic setting circuits corresponding to output circuits 132a of the first power supply system circuit PS1 is fixed to 6 V, and an output potential of the output logic setting circuits corresponding to output circuits 132a of the second power supply system circuit PS2 is between 0 v and 1.5 V.

When the maximum surge current IESDMAX is a positive current and flows through the electrostatic discharge protecting circuit (i.e., when a positive maximum surge current IESDMAX flows from VDD to GND), a forward direction voltage of the electrostatic discharge protecting circuit is 6 V. On the other hand, when the maximum surge current IESDMAX is a negative current and flows through the electrostatic discharge protecting circuit (i.e., when a negative maximum surge current IESDMAX flows from GND to VDD), a reverse direction voltage of the electrostatic discharge protecting circuit is 1.5 V. A forward direction voltage and reverse direction voltage of the separate GND coupling circuit are 4.5 V. A gate breakdown voltage of MOS transistors is 6 V. These voltage values are merely examples for explanation, and the present invention is not limited to these voltage values.

When a surge has been applied and a maximum surge current IESDMAX flows from the power supply terminal VDD1 of the first power supply system circuit PS1 to the power supply terminal VDD2 (=0 V) of the second power supply system circuit PS2 through the route as described above, the maximum voltage applied to the input circuits 131a of the first power supply system circuit PS1 is 12 V. However, a negative voltage with regard to the GND1 reference is inputted, a protecting operation is carried out by the input protecting circuits provided corresponding to the input circuits 131a of the first power supply system circuit PS1. Thus, gates of MOS elements in the input circuits 131a of the first power supply system circuit PS1 are not broken down. In addition, the maximum voltage applied to the input circuits 131a of the second power supply system circuit PS2 is limited to 6 V, and thus, MOS elements in the input circuits 131a of the second power supply system circuit PS2 are also not broken down.

Any of the examples as described may be used as the input protecting circuit provided corresponding to the input circuits 13a shown in FIG. 13 That is, the input protecting circuit which requires a reset signal ESD-RESET may be used. Alternatively, the input protecting circuit which does not require a reset signal ESD-RESET may be used. In addition, a circuit with diodes D in a multi-stage manner, as shown in FIG. 3 or a circuit including a resistor R and a capacitor C, as shown in FIG. 4, is suitable for the surge input detecting circuit 18 shown in FIG. 13.

Each of the electrostatic discharge protecting circuits ESD1 and ESD2 is formed of, for example, a parallel connection circuit of a thyristor and a diode connected in parallel between VDD and GND, the thyristor is connected in the forward direction, and the diode is connected in the reverse direction. Alternatively, the electrostatic discharge protecting circuit is formed of, for example, an NMOS transistor whose drain is connected to VDD and whose source and gate are connected to GND.

The separate GND coupling circuit is formed of, for example, a parallel connection circuit of two diodes connected in parallel, one of the diodes is connected in the forward direction, and the other of the diodes is connected in the reverse direction. Alternatively, the separate GND coupling circuit is formed of, for example, an NMOS transistor whose drain is connected to one terminal of the separate GND coupling circuit and whose source and gate are connected to the other terminal of the separate GND coupling circuit. Further alternatively, the separate GND coupling circuit is formed of, for example, a conductive material member (e.g., metal wiring).

Fourth Embodiment

FIG. 14 is a block diagram of an LSI using a ground line separation technique and two power supplies, according to a fourth embodiment of the present invention, in which only one of two power supply system circuits comprises a surge input detecting circuit for detecting a surge input to a power supply terminal of the power supply system circuit. Hereinafter, an example in which a gate breakdown of an element is prevented according to this embodiment, is described. In this example, a gate breakdown of a MOS element is prevented when a surge is inputted to a power supply terminal of one of two power supply system circuits, and then, a surge current flows toward a power supply terminal of the other of the power supply system circuits.

In the LSI shown in FIG. 14, when a surge has been applied and a maximum surge current IESDMAX flows from a power supply terminal VDD1 of a first power supply system circuit PS1 to a power supply terminal VDD2 (=0 V) of a second power supply system circuit PS2 through an electrostatic discharge protecting circuit ESD1 of the first power supply system circuit PS1, a separate GND coupling circuit 17, and an electrostatic discharge protecting circuit ESD2 of the second power supply system circuit PS2, a potential of the power supply terminal VDD1 of the first power supply system circuit PS1 is 12 V, a potential of a ground terminal GND1 of the first power supply system circuit PS1 is 6 V, and a potential of a ground terminal GND2 of the second power supply system circuit PS2 is 1.5 V. At this time, a voltage across the power supply terminal VDD1 and the ground terminal GND1 of the first power supply system circuit PS1 is 6 V, and a voltage across the power supply terminal VDD2 and the ground terminal GND2 of the second power supply system circuit PS2 is −1.5 V, and a surge input detecting circuit 18 of the second power supply system circuit PS2 outputs an active ESD-RESET signal (1.5 V).

The reset signal ESD-RESET of 1.5 V is supplied to each of input protecting circuits corresponding to input circuits 131a of the second power supply system circuit PS2. The reset signal ESD-RESET is also supplied to each of output logic setting circuits corresponding to output circuits 132a of the second power supply system circuit PS2. However, at this time, the input circuits 131a and output circuits 132a of the second power supply system circuit PS2 are at a non-operation state because of the power supply voltage being negative, and the reset signal ESD-RESET input is invalid.

Furthermore, the reset signal ESD-RESET of 1.5 V is supplied to each of input protecting circuits corresponding to input circuits 131a of the first power supply system circuit PS1. The reset signal ESD-RESET is also supplied to each of output logic setting circuits corresponding to output circuits 132a of the first power supply system circuit PS1. The 1.5 V reset signal ESD-RESET is lower than 6 V of the ground terminal GND1 of the first power supply system circuit PS1, and is thus determined to be "L" in the first power supply system circuit PS1.

As a result, an output potential of the output logic setting circuits corresponding to output circuits 132a of the first power supply system circuit PS1 is fixed to 6 V, and an output potential of the output logic setting circuits corresponding to output circuits 132a of the second power supply system circuit PS2 is between 0 v and 1.5 V.

When the maximum surge current IESDMAX is a positive current and flows through the electrostatic discharge protecting circuit (i.e., when a positive maximum surge current IESDMAX flows from VDD to GND), a forward direction voltage of the electrostatic discharge protecting circuit is 6 V. On the other hand, when the maximum surge current IESDMAX is a negative current and flows through the electrostatic discharge protecting circuit (i.e., when a negative maximum surge current IESDMAX flows from GND to VDD), a reverse direction voltage of the electrostatic discharge protecting circuit is 1.5 V. A forward direction voltage and reverse direction voltage of the separate GND coupling circuit are 4.5 V. A gate breakdown voltage of MOS transistors is 6 V. These voltage values are merely examples for explanation, and the present invention is not limited to these voltage values.

When a surge has been applied and a maximum surge current IESDMAX flows from the power supply terminal VDD1 of the first power supply system circuit PS1 to the power supply terminal VDD2 (=0 V) of the second power supply system circuit PS2 through the route as described above, the maximum voltage applied to the input circuits 131a of the first power supply system circuit PS1 is 12 V. However, a protecting operation is carried out by the input protecting circuits provided corresponding to the input circuits 131a of the first power supply system circuit PS1. Thus, gates of MOS elements in the input circuits 131a of the first power supply system circuit PS1 are not broken down. In addition, the maximum voltage applied to the input circuits 131a of the second power supply system circuit PS2 is limited to 6 V, and thus, MOS elements in the input circuits 131a of the second power supply system circuit PS2 are also not broken down.

Any of the examples as described may be used as the input protecting circuit provided corresponding to the input circuits 13a shown in FIG. 14. That is, the input protecting circuit which requires a reset signal ESD-RESET may be used. Alternatively, the input protecting circuit which does not require a reset signal ESD-RESET may be used. In addition, a circuit with diodes D in a multi-stage manner, as shown in FIG. 3 or a circuit including a resistor R and a capacitor C, as shown in FIG. 4, is suitable for the surge input detecting circuit 18 shown in FIG. 14. In the case where the circuit shown in FIG. 4 is used as a surge input detecting circuit shown in FIG. 14, it is necessary to generate the ERESET or ERESETB signal from a signal of the RC junction node NS shown in FIG. 4 as a signal supplied to the first power supply system circuit PS1. This is because a negative power supply voltage is applied to the second power supply system circuit PS2, the inverters IV1 and IV2 do not operate normally, and thus, normal ERESET or ERESETB cannot be obtained. In order to provide the ESD-RESET signal to the output circuits 131a or the output circuits 132a of the first power supply system circuit PS1, a circuit similar to the inverters IV1 and IV2 as shown in FIG. 4 is provided in the first power supply system circuit PS1. Then, the ERESET or ERESETB signal is generated from the signal of the RC junction node NS by the operation of these inverters IV1 and IV2.

Each of the electrostatic discharge protecting circuits ESD1 and ESD2 is formed of, for example, a parallel connection circuit of a thyristor and a diode connected in parallel between VDD and GND, the thyristor is connected in the forward direction, and the diode is connected in the reverse direction. Alternatively, the electrostatic discharge protecting circuit is formed of, for example, an NMOS transistor whose drain is connected to VDD and whose source and gate are connected to GND.

The separate GND coupling circuit is formed of, for example, a parallel connection circuit of two diodes connected in parallel, one of the diodes is connected in the forward direction, and the other of the diodes is connected in the reverse direction. Alternatively, the separate GND coupling circuit is formed of, for example, an NMOS transistor whose drain is connected to one terminal of the separate GND coupling circuit and whose source and gate are connected to the other terminal of the separate GND coupling circuit. Further alternatively, the separate GND coupling circuit is formed of, for example, a conductive material member (e.g., metal wiring).

Fifth Embodiment

In the first to fourth embodiments as described, there have been shown the examples of using a reset signal ESD-RESET outputted from the surge input detecting circuit provided in either or both of two power supply system circuits through which a surge current flows. In a fifth embodiment according to the present invention, a description will be given with respect to an example of supplying a reset signal ESD-RESET outputted from a surge input detecting circuit provided in a power supply system circuit through which a surge current does not flow to another power supply system circuit through which a surge current flows.

FIG. 15 is a block diagram of an LSI using a ground line separation technique and three power supplies, according to the fifth embodiment of the present invention, in which only one of the three power supply system circuits comprises a surge input detecting circuit for detecting a surge input to a power supply terminal of the power supply system circuit. Hereinafter, an example in which a gate breakdown of an element is prevented according to this embodiment, is described. In this example, a gate breakdown of a MOS element is prevented when a surge is inputted to a power supply terminal of one of two power supply system circuits which do not have surge input detecting circuits, and then, a surge current flows toward a power supply terminal of the other of the two power supply system circuits.

In the LSI shown in FIG. 15, when a surge has been applied and a maximum surge current IESDMAX flows from a power supply terminal VDD1 of a first power supply system circuit PS1 to a power supply terminal VDD2 (=0 V) of a second power supply system circuit PS2 through an electrostatic discharge protecting circuit ESD1 of the first power supply system circuit PS1, a separate GND coupling circuit 17, and an electrostatic discharge protecting circuit ESD2 of the second power supply system circuit PS2, a potential of the power supply terminal VDD1 of the first power supply system circuit PS1 is 12 V, a potential of a ground terminal GND1 of the first power supply system circuit PS1 is 6 V, and a potential of a ground terminal GND2 of the second power supply system circuit PS2 is 1.5 V. At this time, a voltage across the power supply terminal VDD1 and the ground terminal GND1 of the first power supply system circuit PS1 is 6 V, and a voltage across the power supply terminal VDD2 and the ground terminal GND2 of the second power supply system circuit PS2 is −1.5 V.

On the other hand, since a third power supply system circuit PS3 is a circuit which is out of a surge current path, and the power supply terminal VDD3 and ground terminal GND3 are 0 V, respectively. A surge input detecting circuit 18 of the third power supply system circuit PS3 outputs an active ESD-RESET signal (0 V).

The reset signal ESD-RESET of 0 V is supplied to each of input protecting circuits corresponding to input circuits 131a of the first power supply system circuit PS1. The reset signal ESD-RESET is also supplied to each of output logic setting circuits corresponding to output circuits 132a of the first power supply system circuit PS1. In this case, the reset signal ESD-RESET is lower than 6 V of the ground terminal GND1 of the first power supply system circuit PS1, and is thus determined to be "L" in the first power supply system circuit PS1.

Furthermore, the reset signal ESD-RESET of 0 V is supplied to each of input protecting circuits corresponding to input circuits 131a of the second power supply system circuit PS2. The reset signal ESD-RESET is also supplied to each of output logic setting circuits corresponding to output circuits 132a of the second power supply system circuit PS2. However, at this time, the input circuits 131a and output circuits 132a of the second power supply system circuit PS2 are at a non-operation state because of the power supply voltage being negative, and the reset signal ESD-RESET input is invalid.

As a result, an output potential of the output logic setting circuits corresponding to output circuits 132a of the first power supply system circuit PS1 is fixed to 6 V, and an output potential of the output logic setting circuits corresponding to output circuits 132a of the second power supply system circuit PS2 is between 0 V and 1.5 V.

When the maximum surge current IESDMAX is a positive current and flows through the electrostatic discharge protecting circuit (i.e., when a positive maximum surge current IESDMAX flows from VDD to GND), a forward direction voltage of the electrostatic discharge protecting circuit is 6 V. On the other hand, when the maximum surge current IESDMAX is a negative current and flows through the electrostatic discharge protecting circuit (i.e., when a negative maximum surge current IESDMAX flows from GND to VDD), a reverse direction voltage of the electrostatic discharge protecting circuit is 1.5 V. A forward direction voltage and reverse direction voltage of the separate GND coupling circuit are 4.5 V. A gate breakdown voltage of MOS transistors is 6 V. These voltage values are merely examples for explanation, and the present invention is not limited to these voltage values.

When a surge has been applied and a maximum surge current IESDMAX flows from the power supply terminal VDD1 of the first power supply system circuit PS1 to the power supply terminal VDD2 (=0 V) of the second power supply system circuit PS2 through the route as described above, the maximum voltage applied to the input circuits 131a of the first power supply system circuit PS1 is 12 V. However, a protecting operation is carried out by the input protecting circuits provided corresponding to the input circuits 131a of the first power supply system circuit PS1. Thus, gates of MOS elements in the input circuits 131a of the first power supply system circuit PS1 are not broken down. In addition, the maximum voltage applied to the input circuits 131a of the second power supply system circuit PS2 is limited to 6 V, and thus, MOS elements in the input circuit group 131a of the second power supply system circuit PS2 are also not broken down.

In the third power supply system circuit PS3 shown in FIG. 15, no element is shown other than the power supply terminal VDD3, the ground terminal GND1, and the surge input detecting circuit 18. This means that internal circuits, input circuits, and output circuits may be provided or not.

Any of the examples as described may be used as the input protecting circuit provided corresponding to the input circuits 13a shown in FIG. 15. That is, the input protecting circuit which requires a reset signal ESD-RESET may be used. Alternatively, the input protecting circuit which does not require a reset signal ESD-RESET may be used.

In addition, a circuit including a resistor R and a capacitor C, as shown in FIG. 4, is suitable for the surge input detecting circuit 18 shown in FIG. 15. In the case where the circuit shown in FIG. 4 is used as a surge input detecting circuit shown in FIG. 14, it is necessary to generate the ERESET or ERESETB signal from a signal of the RC junction node NS shown in FIG. 4 as a signal supplied to the first power supply system circuit PS1 and the second power supply system circuit PS2. This is because no power supply voltage is applied to the third power supply system circuit PS3, the inverters IV1 and IV2 do not operate normally, and thus, normal ERESET or ERESETB cannot be obtained. In order to provide the ESD-RESET signal to the output circuits 131a or the output circuits 132a of the first power supply system circuit PS1 and the second power supply system circuit PS2, a circuit similar to the inverters IV1 and IV2 as shown in FIG. 4 is provided in the first power supply system circuit PS1 and the second power supply system circuit PS2. Then, the ERESET or ERESETB signal is generated from the signal of the RC junction node NS by the operation of these inverters IV1 and IV2.

Each of the electrostatic discharge protecting circuits ESD1 and ESD2 is formed of, for example, a parallel connection circuit of a thyristor and a diode connected in parallel between VDD and GND, the thyristor is connected in the forward direction, and the diode is connected in the reverse direction. Alternatively, the electrostatic discharge protecting circuit is formed of, for example, an NMOS transistor whose drain is connected to VDD and whose source and gate are connected to GND.

The separate GND coupling circuit is formed of, for example, a parallel connection circuit of two diodes connected in parallel, one of the diodes is connected in the forward direction, and the other of the diodes is connected in the reverse direction. Alternatively, the separate GND coupling circuit is formed of, for example, an NMOS transistor whose drain is connected to one terminal of the separate GND coupling circuit and whose source and gate are connected to the other terminal of the separate GND coupling circuit. Further alternatively, the separate GND coupling circuit is formed of, for example, a conductive material member (e.g., metal wiring).

<Case Where Power Supply System is "n">

Assuming that input circuits and output circuits of each power supply system circuit are collectively referred to as input/output circuits, there have been shown the examples in the first to fourth embodiments, in which the input/output circuits of a power supply system circuit transmit/receive a signal to/from the input/output circuits of another power supply system circuit. Hereinafter, a description will be given with respect to some examples in which the input/output circuits of a power supply system circuit transmit/receive a signal to/from the input/output circuits of other (n-1) power supply system circuits in an LSI using a ground line separation technique and "n" power supplies.

Figure 16:
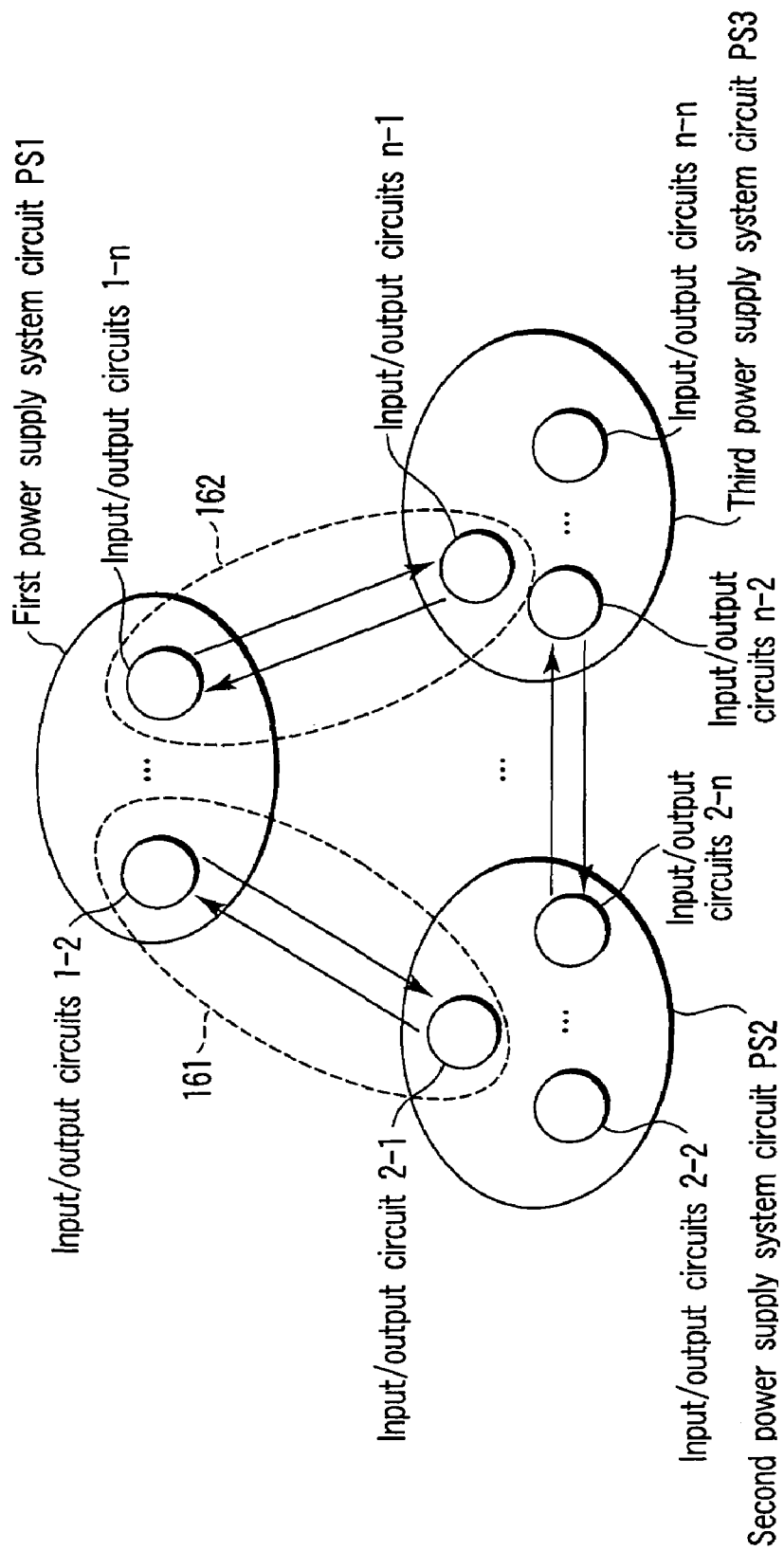
FIG. 16 is a block diagram showing an example in which, when each signal transmitter/receiver circuit group is assumed to be a 2-system circuit with respect to an LSI in which "n" power supply systems are provided, any one of the first to fourth embodiments is applied.

In LSIs shown in FIGS. 16 and 17, input/output circuits 1-2 and 2-1 for transmitting/receiving a signal between two power supply system circuits are collectively referred to as signal transmission/reception circuits 161. Similarly, input/output circuits 1-n and n-1 are collectively referred to as signal transmission/reception circuits 162. Similarly, input/output circuits 2-n and n-2 are collectively referred to as further signal transmission/reception circuits. In each of the power supply system circuits PS1 and PS2, circuit elements (internal circuits, power supply terminals, ground terminals, separate GND coupling circuits, electrostatic discharge protecting circuits between VDD and GND, and the like) other than the input/output circuits 1-2 and 2-1 to 2-*n* are not shown.

<First Application Example Showing an Example in which The First Embodiment is Applied, Assuming that, in an LSI in which "n" Power Supply Systems are Provided, the Signal Transmission/Reception Circuits are Associated with Two Power Supply System Circuits>

In the LSI shown in FIG. 16, a surge input detecting circuit (shown in FIG. 3, for example) is provided in each of the power supply system circuits PS1, PS2, . . . PSn.

<Second Application Example Showing an Example in which>the Second Embodiment is Applied, Assuming that, in an LSI in which "n" Power Supply Systems are Provided, the Signal Transmission/Reception Circuits are Associated with Two Power Supply System Circuits>

In the LSI shown in FIG. 16, surge input detecting circuits (shown in FIG. 9, for example) are provided in the signal transmission/reception circuits 161 between the first power supply system circuit PS1 and the second power supply system circuit PS2 and in the signal transmission/reception circuits 162 between the first power supply system circuit PS1 and the n-th power supply system circuit PSn. The surge input detecting circuits in each of the signal transmission/reception circuits each refer a potential of the power supply terminal of the power supply system circuit to which the other surge input detecting circuit belongs.

A reset signal ESD-RESET is inputted to the input/output circuit 1-2 of the signal transmission/reception circuit 161 of the first power supply system circuit PS1. The reset signal ESD-RESET is generated by a surge input detecting circuit, which refers to a potential of the power supply terminal VDD2 of the second power supply system circuit PS2. A reset signal ESD-RESET is inputted to the input/output circuit 2-1 of the signal transmission/reception circuit 161 of the second power supply system circuit PS2. The reset signal ESD-RESET is generated by a surge input detecting circuit, which refers a potential of the power supply terminal VDD1 of the first power supply system circuit PS1.

On the other hand, a reset signal ESD-RESET is inputted to the input/output circuit 1-*n* of the signal transmission/reception circuit 162 of the first power supply system circuit PS1. The reset signal ESD-RESET is generated by a surge input detecting circuit, which refers a potential VDDn of the n-th power supply system circuit PSn. A reset signal ESD-RESET is inputted to the input/output circuit n-1 of the signal transmission/reception circuit 162 of the n-th power supply system circuit PSn. The reset signal ESD-RESET is generated by a surge input detecting circuit, which refers a potential of the power supply terminal VDD1 of the first power supply system circuit PS1.

<Third Application Example Showing an Example in which the Third or Fourth Embodiment is Applied, Assuming that, in an LSI in which "n" Power Supply Systems are Provided, the Signal Transmission/Reception Circuits>are Associated with Two Power Supply System Circuits In the LSI shown in FIG. 16, a surge input detecting circuit which generates the reset signals ESD-RESET for use in the signal transmission/reception circuit 161 between the first power supply system circuit PS1 and the second power supply system circuit PS2 is composed of, for example, the resistor R and the capacitor C, as shown in FIG. 4. The surge input detecting circuit is provided in the first power supply system circuit PS1 or the second power supply system circuit PS2. A surge input detecting circuit which generates the reset signals ESD-RESET for use in the signal transmission/reception circuit 162 between the first power supply system circuit PS1 and the n-th power supply system circuit PSn is also composed of, for example, the resistor R and the capacitor C, as shown in FIG. 4. The surge input detecting circuit is provided in the first power supply system circuit PS1 or the n-th power supply system circuit PS2.

In the case where the surge input detecting circuits which generate the reset signals ESD-RESET for the signal transmission/reception circuit 161 and the surge input detecting circuist which generate the reset signals ESD-RESET for the signal transmission/reception circuit 162 are provided in the same power supply system circuit, they may not be individually provided. A reduced number of surge input detecting circuits may be provided and shared to reduce the circuit scale.

Surge input detecting circuits can be provided in signal transmission/reception circuits other than the signal transmission/reception circuits 161 and 162 in the same manner as described above.

<Fourth Application Example Showing an Example in which the Fifth Embodiment is Applied, Assuming that, in an LSI in which "n" Power Supply Systems are Provided, the Signal Transmission/Reception Circuits are Associated with Two Power Supply System Circuits>

In the LSI shown in FIG. 17, a surge input detecting circuit 18 which generates the reset signals ESD-RESET for use in the signal transmission/reception circuit 161 between the first power supply system circuit PS1 and the second power supply system circuit PS2 is provided at the other power supply system circuit (in this example, a third power supply system circuit PS3).

In this case, it is necessary to shut down at the same time a power supply system circuit to which the surge input detecting circuit 18 belongs (i.e., third power supply system circuit PS3 in this example) and at least one of two power supply system circuits including the signal transmission/reception circuit 161 (i.e., first power supply circuit PS1 and second power supply circuit PS2 in this example). In this example, it is necessary to shut down at the same time the first power supply system circuit PS1 and the third power supply system circuit PS3, or the second power supply system circuit PS2 and the third power supply system circuit PS3.

Surge input detecting circuits can be provided, in the same manner as described above, for other signal transmission/reception circuits than the signal transmission/reception circuit 161 (for example, signal transmission/reception circuit 162 between the first power supply system circuit PS1 and the n-th power supply system circuit PSn).

Sixth Embodiment

FIG. 18 is a block diagram of an LSI using a ground line separation technique and three power supplies, according to a sixth embodiment of the present invention. Hereinafter, an example in which a gate breakdown of an element is prevented according to this embodiment, is described. In this example, a gate breakdown of a MOS element is prevented when a surge is inputted to a power supply terminal of one of three power supply system circuits, and then, a surge current flows toward a power supply terminal of another of the power supply system circuits. In an LSI circuit shown in FIG. 18, the power supply voltages of three power supply system circuits PS1, PS2, and PS3 are 1.5 V, for example.

A second ground line 32 connected to a ground terminal GND2 of the second supply system circuit PS2 is connected to a first ground line 31 connected to a ground terminal GND1 of the first supply system circuit PS1 through a diode circuit comprising back-to-back connected diodes DF and DR. Also, the second ground line 32 is connected to a third ground line 33 connected to a ground terminal GND3 of the third supply system circuit PS3 through a diode circuit comprising back-to-back connected diodes DF and DR. With this structure, the ground lines 31, 32, and 33 are separated one from the other. A resistance component of the second ground line 32 is shown by R.

Electrostatic discharge protecting circuits ESD1, ESD2, and ESD3 of, for example, 1.5 V system are connected between a power supply line and a ground line of the power supply system circuits PS1, PS2, and PS3, correspondingly. In addition, in each of the power supply system circuits PS1, PS2, and PS3, an input protecting circuit 14 of such a type in which, for example, does not require a reset signal is connected to an input side of an internal circuit, and an output logic setting circuit 15 is connected to an output side of the internal circuit.

An example of operation of the circuit shown in FIG. 18 will be described hereafter. Assume that a surge is applied, and a maximum surge current IESDMAX flows from a power supply terminal VDD2 of the second power supply system circuit PS2 through the electrostatic discharge protecting circuit ESD2, the second ground line 32, the third ground line 33, the electrostatic discharge protecting circuit ESD3, and a power supply terminal VDD3 of the third power supply system circuit PS2.

When the maximum surge current IESDMAX is a positive current and flows through the electrostatic discharge protecting circuit (i.e., when a positive maximum surge current IESDMAX flows from VDD to GND), a forward direction voltage of the electrostatic discharge protecting circuit is 6 V. On the other hand, when the maximum surge current IESDMAX is a negative current and flows through the electrostatic discharge protecting circuit (i.e., when a negative maximum surge current IESDMAX flows from GND to VDD), a reverse direction voltage of the electrostatic discharge protecting circuit is 1.5 V. A forward direction voltage and reverse direction voltage of the separate GND coupling circuit are 4.5 V. A gate breakdown voltage of MOS transistors is 7 V. These voltage values are merely examples for explanation, and the present invention is not limited to these voltage values.

When a surge has been applied and a maximum surge current IESDMAX flows from the power supply terminal VDD2 of the second power supply system circuit PS2 to the power supply terminal VDD3 of the third power supply system circuit PS3 through the route as described above, the power supply terminal VDD2 of the second power supply system circuit PS2 becomes, for example, 12 V, and the power supply terminal VDD3 of the third power supply system circuit PS3 becomes, for example, 0 V. Then the ground terminal GND2 connected to the second ground line 32 becomes 6 V, a voltage drop across of the resistance component R of the second ground line 32 becomes 3 V, and the third ground line 31 and the ground terminal GND3 connected thereto become 1.5 V. Since the first power supply system circuit PS1 is not included in the surge current path, the first ground line 31, the ground terminal GND1 connected thereto, and a power supply terminal VDD1 of the first power supply system circuit PS1 are maintained at 0 V.

Since the breakdown voltage of elements is 7 V, if a voltage between an input of the gate and the VDD/GND is lower than 7 V, the elements are not broken down.

When a level of a signal inputted from the first power supply system circuit PS1 to the second power supply system circuit PS2 is set to 0 V, an input node of an inverter circuit IV at a succeeding stage of the input protecting circuit 14 of the second power supply system circuit PS2 is set to 5 V, and a voltage difference between the input node of the inverter circuit IV and the power supply voltage 12V upon an ESD voltage application is 7 V. Thus, no problem occurs with a breakdown voltage.

A voltage difference between the ground terminal GND1 of the first power supply system circuit PS1 and an input node of the inverter circuit IV of the first power supply system circuit PS1 inputted with a signal (6 V of "L" level) outputted from the output logic setting circuit 15 of the first power supply system circuit PS1 is 6 V, and a difference between the input node of the inverter circuit IV of the first power supply system circuit PS1 and the power supply voltage 0V upon an ESD voltage application is 6 V. Thus, no problem occurs with a breakdown voltage.

A voltage difference between the ground terminal GND3 of the third power supply system circuit PS3 and an input node of an inverter circuit IV at a succeeding stage of the input protecting circuit 14 of the third power supply system circuit PS3 is set to 4.5 V, and a difference between the input node of the inverter circuit IV of the third power supply system circuit PS3 and the power supply voltage 0V upon an ESD voltage application is 6 V. Thus, no problem occurs with a breakdown voltage.

Each of the electrostatic discharge protecting circuits ESD1, ESD2 and ESD3 is formed of, for example, a parallel connection circuit of a thyristor and a diode connected in parallel between VDD and GND, the thyristor is connected in the forward direction, and the diode is connected in the reverse direction. Alternatively, the electrostatic discharge protecting circuit is formed of, for example, an NMOS transistor whose drain is connected to VDD and whose source and gate are connected to GND.

As shown in FIG. 18, the separate GND coupling circuit is formed of, for example, a parallel connection circuit of two diodes connected in parallel, one of the diodes is connected in the forward direction, and the other of the diodes is connected in the reverse direction. Alternatively, the separate GND coupling circuit is formed of, for example, an NMOS transistor whose drain is connected to one terminal of the separate GND coupling circuit and whose source and gate are connected to the other terminal of the separate GND coupling circuit. Further alternatively, the separate GND coupling circuit is formed of, for example, a conductive material member (e.g., metal wiring).

<Specific Example of Second Application Example>

Figure 19:
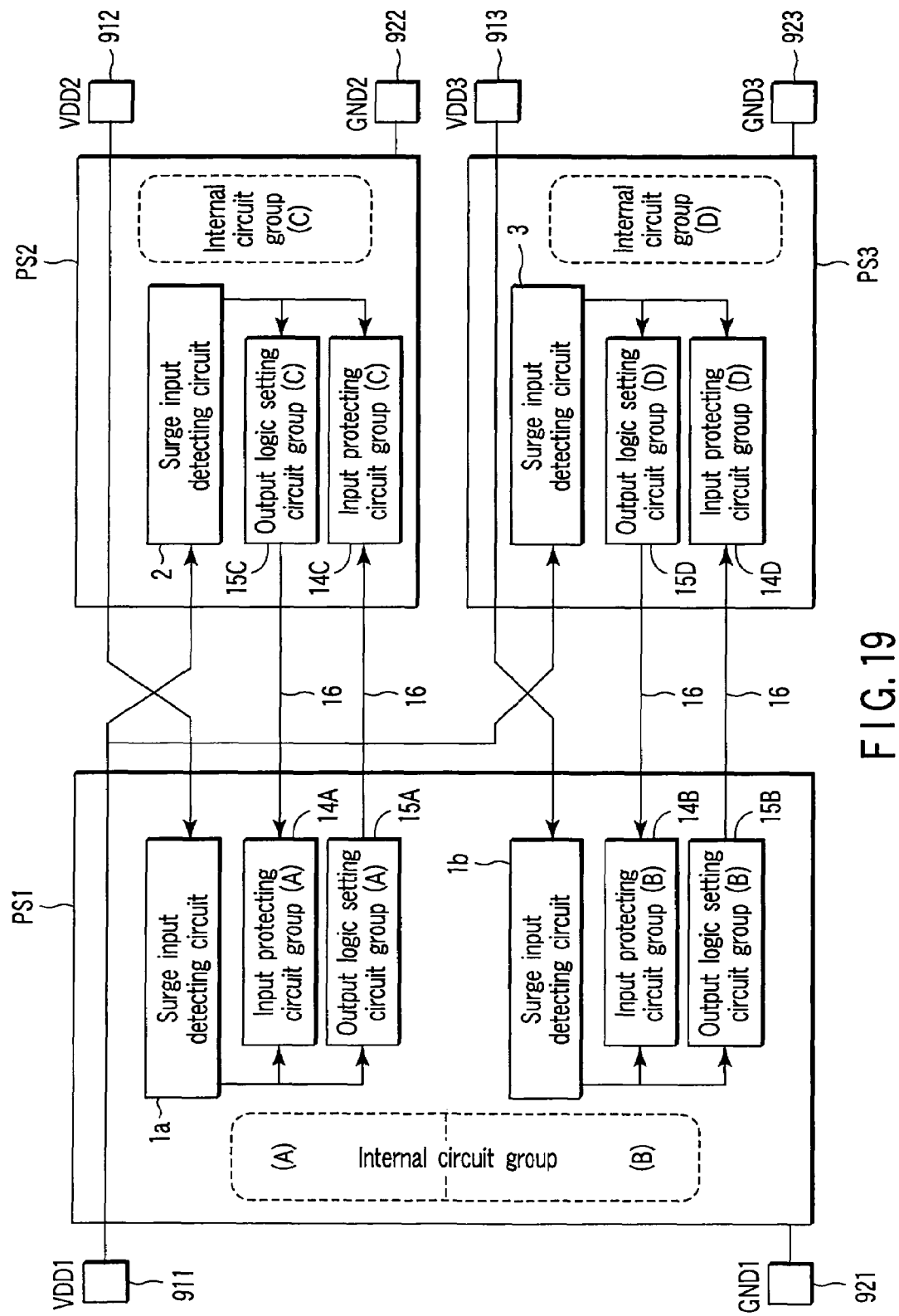
FIG. 19 is a block diagram showing an example in which, when each signal transmitter/receiver circuit group is assumed to be a 2-system circuit with respect to an LSI in which "n" power supply systems are provided, and the second embodiment is applied (the second application).

FIG. 19 shows a specific example of the second application example, and schematically shows a portion of a CMOS LSI having three power supply terminals to which power supply voltages are applied during operation. In FIG. 19, there is shown a connection relationship between internal circuits, output protecting circuits and output logic setting circuits connected to input side and an output side of the internal circuits, among three power supply system circuits PS1 to PS3 in which the ground lines are separated.

In FIG. 19, reference numeral 911 denotes a power supply terminal (VDD1 pad) applied with a first power supply voltage VDD1 in the normal operation, and reference numeral 921 denotes a ground terminal (GND1 pad) applied with a first ground voltage GND1. Reference numeral 912 denotes a power supply terminal (VDD2 pad) applied with a second power supply voltage VDD2 in the normal operation, and reference numeral 922 denotes a ground terminal (GND2 pad) applied with a second ground voltage GND2. Reference numeral 913 denotes a power supply terminal (VDD3 pad) applied with a third power supply voltage VDD3 in the normal operation, and reference numeral 923 denotes a ground terminal (GND3 pad) applied with a third ground voltage GND3.

In the first power supply system circuit PS1, the second power supply system circuit PS2, and the third power supply circuit PS3, the electrostatic discharge protecting circuits ESD1, SED2, and ESD3 as shown in FIG. 18 are connected respectively between a power supply terminal and a ground terminal, though not shown. A diode circuit, not shown, composed of back-to-back connected diodes RF and DR, as shown in FIG. 18, is connected between a GND1 pad and a GND2 pad and between the GND1 pad and a GND3 pad. In addition, the ground line of each of the power supply system circuits PS1 to PS3 is separated.

In this example, internal circuits of the first power supply system circuit PS1 is divided into two internal circuit groups (A) and (B). An input protecting circuit group (A) 14A and an output logic setting circuit group (A) 15A are provided in association with the internal circuit group (A). In addition, a surge input detecting circuit 1a is provided in association with the internal circuit group (A) to detect an ESD input applied to the power supply line of the second power supply system circuit PS2. A detection output of the surge input detecting circuit 1a is supplied as a reset signal ESD-RESET to the input protecting circuit group (A) 14A and the output logic setting circuit group (A) 15A.

Similarly, an input protecting circuit group (B) 14B and an output logic setting circuit group (B) 15B are provided in association with the internal circuit group (B) of the first power supply system circuit PS1. In addition, a surge input detecting circuit 1b is provided in association with the internal circuit group (B) to detect an ESD input applied to the power supply line of the third power supply system circuit PS3. A detection output of the surge input detecting circuit 1b is supplied as a reset signal ESD-RESET to the input protecting circuit group (B) 14B and the output logic setting circuit group (B) 15B.

Input protecting circuits (C) 14C and output logic setting circuits (C) 15C are provided in association with the internal circuits (C) of the second power supply system circuit PS2. In addition, a surge input detecting circuit 2 is provided in association with the internal circuit group (C) to detect an ESD input applied to the power supply line of the first power supply system circuit PS1. A detection output of the surge input detecting circuit 2 is supplied as a reset signal ESD-RESET to the input protecting circuits (C) 14C and the output logic setting circuits (C) 15C.

Similarly, input protecting circuits (D) 14D and output logic setting circuits (D) 15D are provided in association with the internal circuits (D) of the third power supply system circuit PS3. In addition, a surge input detecting circuit 3 is provided in association with the internal circuit group (D) to detect an ESD input applied to the power supply line of the first power supply system circuit PS1. A detection output of the surge input detecting circuit 3 is supplied as a reset signal ESD-RESET to the input protecting circuits (D) 14D and the output logic setting circuits (D) 15D.

In the first power supply system circuit PS1 and the second power supply system circuit PS2, references are made each to a power supply potential of the other power supply system circuit to detect an ESD input to the power supply line of said other power supply system circuit, and the input protecting circuits and output logic setting circuits of one power supply system circuit (i.e., not said other power supply system circuit) are operated to carry out an ESD protecting operation. During normal operation, the protecting operation by the input protecting circuits or output logic setting circuits is not effected.

In the internal circuits of the internal circuit group (B) in the first power supply system circuit PS1 and internal circuits (D) in the third power supply system circuit PS3, references are made each to a power supply potential of the other power supply system circuit to detect an ESD input to the power supply line of said other power supply system circuit, and the input protecting circuits and output logic setting circuits of one power supply system circuit (i.e., not said other power supply system circuit) are operated to carry out an ESD protecting operation. During normal operation, the protecting operation by the input protecting circuits or output logic setting circuits is not effected.

A circuit including a resistor R and diodes D, as shown in, for example, FIG. 9, is used as the surge input detecting circuits 1a, 1b, 2, and 3. In this case, the level detection type ESD-RESET signal generator circuit as shown in FIG. 3 or the delay type ESD-RESET signal generator circuit as shown in FIG. 4 may not be provided, facilitating LSI production.

An example of an operation of the CMOS LSI shown in FIG. 19 will be described hereinbelow.

A basic operation is described first. In the case where a surge input has been applied to one power supply system circuit, the surge input is detected by a surge input detecting circuit of another power supply system circuit. By using the detection output of the surge input detecting circuit, an input circuit to which a signal from said one power supply system circuit is protected, and an output logic level of an output circuit which outputs a signal to said one power supply system circuit is set to "L".

The CMOS LSI shown in FIG. 19 is featured in that the surge input detecting circuits each are provided correspondingly to power supply system circuits to which the input circuit or the output circuit is connected. Therefore, for example, when only the second power supply system circuit PS2 is shut down, the shutdown is detected by the surge input detecting circuit 1a of the first power supply system circuit PS1. In addition, there becomes a state by the detection output of the surge input detecting circuit 1a, in which the input protecting circuit group (A) 14A and the output logic setting circuit group (A) 15A carries out a protecting operation. The input protecting circuit group (A) 14A and the output logic setting circuit group (A) 15A transmit and receive signals to and from the output logic setting circuit (C) 15C and the input protecting circuit group (C) 14C corresponding to the input circuits (C) of the second power supply system circuit PS2. At this time, since the second power supply system circuit PS2 is shut down, no problem occurs. In addition, in the first power supply system circuit PS1, an operation of the input protecting circuit group (B) 14B and the output logic setting circuit group (B) 15B is not affected by the shutdown of the second power supply system circuit PS2 or the protecting operation of the input protecting circuit group (A) 14A and output logic setting circuit group (A) 15A.

When only the third power supply system circuit PS3 is shut down, the shutdown is detected by the surge input detecting circuit 1b of the first power supply system circuit PS1. In addition, there becomes a state by the detection output of the surge input detecting circuit 1b, in which the input protecting circuit group (B) 14B and the output logic setting circuit group (B) 15B at the input side of the internal circuit group (B) carries out a protecting operation. At this time, since the third power supply system circuit PS3 is shut down, no problem occurs. In addition, in the first power supply system circuit PS1, an operation of the output logic setting circuit group (A) 15A and the output logic setting circuit group (A) 15A is not affected by the shutdown of the third power supply system circuit PS3 or the protecting operation of the input protecting circuit group (B) 14B and output logic setting circuit group (B) 15B.

When only the first power supply system circuit PS1 is shut down, the shutdown is detected by the surge input detecting circuit 2 of the second power supply system circuit PS2. In addition, there becomes a state by the detection output of the surge input detecting circuit 2, in which the input protecting circuit group (C) 14C and the output logic setting circuit group (C) 15C at the input side of the internal circuits (C) carries out a protecting operation. In addition, when only the first power supply system circuit PS1 is shut down, the shutdown is also detected by the surge input detecting circuit 3 of the third power supply system circuit PS3, and there becomes a state by the detection output of the surge input detecting circuit 3, in which the input protecting circuit group (D) 14D and the output logic setting circuit group (D) 15D at the input side of the internal circuits (D) carries out a protecting operation. At this time, since the first power supply system circuit PS1 is shut down, no problem occurs.

<Another Example Relating to Supply of ESD-RESET Signal>

In the embodiments as described, there has been used the reset signal ESD-RESET generated by detecting the surge input in the case where the input protecting circuit at the input side of the internal circuit and the output logic setting circuit at the output side of the internal circuit require a reset signal. However, a reset signal ESD-RESET may be externally inputted.

In addition, it is possible to share as an ESD-RESET signal line an existing signal line provided for a power down signal supplied to the LSI chip in order to restrict current consumption by stopping a circuit operation while the power for the LSI chip is being ON or a power ON reset signal generated when the power of the LSI chip is turned ON. In order to achieve the sharing, for example, a power down signal (active level is set to "H") and a ERESETB signal (active level is set to "H") are inputted to an OR gate, and its output is connected to a common line to supply the power down signal and the ERESETB signal to the common line. In addition, the common line is connected not only to existing circuits using a power down signal and a power on reset signal but also to the input protecting circuit and the output logic setting circuit as described.

Similarly, it is also possible to provide not only a power down signal and a power ON reset signal but also an ESD-RESET signal to a power down signal terminal or a reset signal terminal of part of internal circuits (for example, AD converter, DA converter, analog circuit block such as PLL, or a macro circuit such as digital block). In order to achieve this, an input circuit and an output circuit of such an internal circuit are constructed with a circuit capable of input protection or a circuit capable of fixing an output logic. In addition, signal lines of such an internal circuit, connected to a power down signal terminal and a reset signal terminal, are connected to the circuit capable of input protection and the circuit capable of fixing an output logic.

<Design Technique if Applied to Logic Synthesis or Automatic Design Using an Automatic Place and Route>

In the case where the embodiments as described are applied to logic synthesis or automatic design using an automatic place and route, if an input circuit with an input protecting circuit, an output circuit with an output logic setting circuit, and a surge input detecting circuit, as described, are registered as cells, it is possible to design the LSIs of the embodiments, without necessity of paying attention to the input protecting circuit, output logic setting circuit, and surge input detecting circuit as described.

In such a case, for example, in logic synthesis or prior to layout design after the logic synthesis, based on information on the presence or absence of a power supply system circuit and a combination of shutdown of the power supply system circuits, and the like, the input circuit and output circuit of each of the power supply system circuits may be automatically replaced with an input circuit having an input protecting circuit and an output circuit having an output logic setting circuit, and also a signal line to which a surge input detecting circuit is connected may be inserted.

According to the semiconductor integrated circuit apparatus of each of the embodiments of the present invention, in the case where a ground line separation technique and a plurality of power supplies are employed, an insulation break down of an input gate of an internal circuit due to a voltage drop across a resistance component when a surge current flows through a ground line can be prevented, and reliability can be enhanced.

In the semiconductor integrated circuit apparatus of each of the embodiments of the present invention, descriptions are made when the potentials of the ground sides of the plurality of power supply system circuits are equal. This manner is generally effective for LSIs in which a P type semiconductor substrate is used.

On the other hand, in the case where LSIs are to be formed by using an N type semiconductor substrate, the LSIs are structured such that the potentials of the power supply sides of the plurality of power supply system circuits are equal. In this case, advantages similar to those as obtained in the above-described embodiments can be obtained. To be specific, in the case of LSIs using an N type semiconductor substrate, the following alterations are made to the above-described embodiments. The AND gate circuit of the output logic setting circuit is changed to an OR gate circuit to set the logic level of the output signal to "H" level, and the reset signal ESD-RESET is changed from ERESET to ERESETB. In the input protecting circuit in FIGS. 2 and 6, changes are made such that ground potential is applied to VDD and a power supply potential is applied to GND. All of the NMOS transistors are changed to PMOS transistors, and vice versa. In the input protecting circuit in FIG. 7, changes are made such that a power supply potential is applied to GND, and the direction of the diode D is reversed. In FIGS. 11-15 and 18, a change is made such that the separate GND coupling circuit is connected not between the ground terminals, but between the power supply terminals.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit apparatus comprising:
   a plurality of power supply system circuits, in which power supply terminals or ground terminals, or the power supply terminals and the ground terminals, are separated from each other between the power supply system circuits;
   an electrostatic discharge protecting circuit connected between a power supply terminal and a ground terminal of each of the power supply system circuits;
   an internal circuit provided in each of the power supply system circuits;
   an internal signal transmitting line which transmits a signal from an internal circuit of a first power supply system circuit of the power supply system circuits to an internal circuit of a second power supply system circuit of the power supply system circuits;
   a surge input detecting circuit which detects a surge input to at least one of the power supply terminals; and
   an input protecting circuit which is provided at an input side of the internal circuit of the first power supply system circuit, in which the input protecting circuit and the output logic setting circuit are controlled in response to an output of the surge input detecting circuit so that, when the surge input detecting circuit detects a surge input, the input protecting circuit limits a voltage to be applied to an element in the input protecting circuit and the output logic setting circuit limits a voltage of a signal transmitted from the internal signal transmitting line, and an output logic setting circuit which is provided at an output side of the internal circuit and which sets a logic level of a signal outputted to the internal signal transmitting line to a predetermined level.

2. A semiconductor integrated circuit apparatus according to claim 1, wherein the surge input detecting circuit has a high threshold voltage level not to detect a state in which a normal power supply voltage is applied to the power supply terminals and to detect a state in which a surge input higher than the normal power supply voltage is applied to at least one of the power supply terminals.

3. A semiconductor integrated circuit apparatus according to claim 1, wherein the surge input detecting circuit does not respond to a time period during which a normal power supply voltage is applied to the power supply terminals, and responds to an instantaneous pulse of the surge input applied to at least one of the power supply terminals.

4. A semiconductor integrated circuit apparatus according to claim 1, wherein the surge input detecting circuit comprises:
   a current limiting resistor element whose one end is applied with a surge input; and
   a diode connected between another end of the resistor element and a ground potential of a power supply system circuit to which the surge input detecting circuit belongs, and a diode connected between said another end of the resistor element and a power supply potential of the power supply system circuit to which the surge input detecting circuit belongs.

5. A semiconductor integrated circuit apparatus according to claim 1, wherein the input protecting circuit comprises a PMOS transistor at one end connected to the internal signal transmitting line, and when the surge input detecting circuit detects a surge input, a potential of the substrate of the PMOS transistor inputted with a signal from the internal signal transmitting line is set to a potential of the ground terminal of the power supply system circuit to which the input protecting circuit belongs.

6. A semiconductor integrated circuit apparatus according to claim 1, wherein the input protecting circuit comprises a PMOS transistor at one end connected to the internal signal transmitting line, and when a potential lower than a normal power supply voltage is inputted, a potential of the substrate of the PMOS transistor is set to a potential of the ground terminal of the power supply system circuit to which the input protecting circuit belongs.

7. A semiconductor integrated circuit apparatus according to claim 1, wherein the input protecting circuit comprises a current limiting resistor element and a diode element, the current limiting resistor element being connected between an input node to which a signal is inputted via the internal signal transmitting line and an output node from which a signal is outputted to the internal circuit corresponding to the input protecting circuit, and the diode element being connected in a forward direction between a ground line and the output node.

8. A semiconductor integrated circuit apparatus according to claim 1, wherein the input protecting circuit comprises a current limiting resistor element, a first diode element and a second diode element, the current limiting resistor element being connected between an input node to which a signal is inputted via the internal signal transmitting line and an output node from which a signal is outputted to the internal circuit corresponding to the input protecting circuit, the first diode element being connected in a forward direction between a ground line and the output node, and the second diode element being connected in a forward direction between the output node and a power supply line.

9. A semiconductor integrated circuit apparatus according to claim 1, wherein the output logic setting circuit comprises a logical product circuit for taking a logical product of an output of the internal circuit corresponding to the output logic setting circuit and a detection output outputted from the surge input detecting circuit when the surge input detecting circuit detects a surge input, and when the surge input detecting circuit detects a surge input, outputs a potential of the ground terminal of the power supply system circuit to which the output logic setting circuit belongs.

10. A semiconductor integrated circuit apparatus according to claim 1, wherein the surge input detecting circuit detects a surge being inputted to the power supply terminal to which the surge input detecting circuit belongs.

11. A semiconductor integrated circuit apparatus according to claim 1, wherein the surge input detecting circuit detects a surge being inputted to the power supply terminal to which the surge input detecting circuit does not belong.

12. A semiconductor integrated circuit apparatus according to claim 1, wherein a separate ground coupling circuit is inserted between the ground terminals being separated.

13. A semiconductor integrated circuit apparatus according to claim 1, wherein an input circuit with an input protecting circuit, which is registered as a cell, is provided at the input side of the internal circuit, an output circuit with an output logic setting circuit, which is registered as a cell, is provided at the output side of the internal circuit, and a surge input detecting circuit, which is registered as a cell, is provided as the surge input detecting circuit.

14. A semiconductor integrated circuit apparatus according to claim 1, wherein the predetermined level is an "L" logic level.

15. A semiconductor integrated circuit apparatus according to claim 1, wherein the predetermined level is an "H" logic level.

* * * * *